Figure 1:
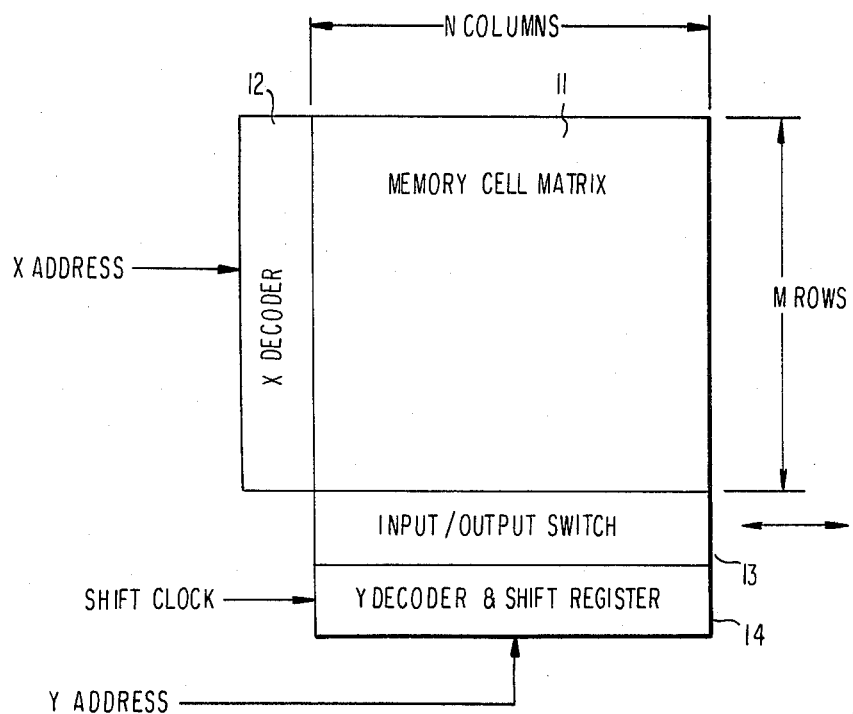

United States Patent [19]

Kobayashi et al.

[11] 4,429,375

[45] Jan. 31, 1984

[54] CONSECUTIVE ADDRESSING OF A SEMICONDUCTOR MEMORY

[75] Inventors: Satoru Kobayashi; Shigeki Matsue, both of Tokyo, Japan

[73] Assignee: Nippon Electric Co., Ltd., Tokyo, Japan

[21] Appl. No.: 286,398

[22] Filed: Jul. 23, 1981

[30] Foreign Application Priority Data

Jul. 23, 1980 [JP] Japan ............................ 55-100850

[51] Int. Cl.³ .................... G11C 7/00; G11C 8/00
[52] U.S. Cl. ............................................ 365/240
[58] Field of Search ................... 365/239, 240, 241

[56] References Cited

U.S. PATENT DOCUMENTS 3,930,239  12/1975  Salters et al. .................. 365/240

Primary Examiner—George G. Stellar
Attorney, Agent, or Firm—Sughrue, Mion, Zinn, Macpeak and Seas

[57] ABSTRACT

A high speed memory device comprises memory cells arrayed in rows and columns, a row decoder for selecting the rows, a column decoder for selecting the columns, a shift register arranged in parallel with the column decoder, and control means for operatively enabling the shift register, in which consecutive access to a plurality of memory cells belonging to the same selected row can be performed from the column address designated by the column decoder.

11 Claims, 17 Drawing Figures

CONSECUTIVE ADDRESSING OF A SEMICONDUCTOR MEMORY

The present invention relates to a memory device, and more particularly, to a semiconductor memory device fabricated on a semiconductor substrate.

In semiconductor memories making use of insulated gate field effect transistors (IGFET), such as, MOS semiconductor memories employing MOS transistors, memory capacity has been steadily increasing at a rate of twice per year owing to the rapid progress of the integration technique, especially fine patterning technique, in the recent years. Memories having storage capacities of 1K bits, 4K bits, 16K bits and 64K bits have been successively made commercially available. 256K bit memories have been produced on the laboratory scale, and realization of 1M bit memories is also expected in the near future. Moreover, owing to the progress of the circuit technique, a number of pins in a package has been decreased and a mount density of memory devices has been increased by multiple-addressing technique detailed in U.S. Pat. No. 3,969,706 and reduction in a number of power sources and an operation speed of a memory element itself has been raised. Thus, the usefulness of the memories has been enhanced. In view of such peculiar nature of the recent memories, 16-pin high speed 16K bit memories have been employed in the main memory of the recent large scale or super large scale computers, and have largely contributed to the improvements in performance of computers.

Between a main memory and a central processing unit (hereinafter called CPU) is interposed a buffer memory for compensating the difference in operation speeds therebetween and enhancing a processing speed of a CPU. Mutual data exchanges are generally affected on information block units having a fixed length of several tens bytes. In addition, contrivance in a system construction called "interleave" has been made, in which in order to enhance a throughout of a memory, a memory card group forming a main memory is divided into a plurality of banks, and consecutive successive addressed are allotted to these banks. Thus, parallel processing is effected, and also improvements in operation speed are achieved by shortening of an average memory cycle period and by page mode operations. In any event, the pursuit of an operation speed of a system by employing such improved memory devices, is associated with a limit. Moreover, even if large capacity memories are adopted to enhance memory density in the system, since the handled information consists, in most case, of a series of consecutive fixed-length data, a large capacity memory having a large number of words is sometimes inadequate for a system construction.

It is therefore one object of the present invention to provide a memory device, in which access operation can be made at a high speed.

It is another object of the present invention to provide a semiconductor memory device in which a series of consecutive addresses having an arbitrary or particular length can be accessed at a high speed.

A memory device according to the present invention comprises memory cells arrayed in a matrix form of M rows X N columns, an X-decoder for selecting M rows, a Y-decoder for selecting N columns, and a shift register provided in association with a Y-decoder, which shift register takes in and holds address information upon decision by the Y-decoder and thereafter operates in response to a shift clock produced by a shift control circuit. Since the shift register can be easily coupled to the heretofore known memory device such as one disclosed in U.S. Pat. No. 3,969,706 relying upon the drive system employing a sense amplifier and a pair of I/O buses, there is provided a quite novel memory device in which access to consecutive addresses is possible.

In addition, the present invention is also applicable to a memory device of the type employing a plurality of pairs of I/O buses. More particularly, in a memory device provided with an X-decoder and a Y-decoder for selecting M rows and N columns, respectively, of a memory cell matrix of M rows X N columns, address information fed to the Y-decoder for selecting the N columns is divided into two parts, one part being fed to a Y-decoder of the heretofore known type so as to connect some of columns to a plurality of pairs of I/O buses, the other part being fed to a Y-decoder provided with a shift register for selecting the plurality of pairs of I/O buses, and thereby a memory device equivalent to the above-described one can be obtained.

The memory device according to the present invention can realize a quite novel function upon heretofore known page mode operation in a two-phase clock system employing an $\overline{RAS}$ (Row Address Strobe) and a $\overline{CAS}$ (Column Address Strobe). In the conventional page mode, a memory cell designated by X- and Y-address information can be accessed in RAS/CAS cycles, in which at first the memory is activated in response to transition of the $\overline{RAS}$ clock from a logic "1" level to a logic "0" level, the X-address information is taken in, and subsequently in response to activation of the $\overline{CAS}$ clock, the Y-address information is taken in. In this case, contrivance is made such that the $\overline{CAS}$ may be activated after the X-address information has been taken in by the $\overline{RAS}$ and also it may be activated in dependence upon the $\overline{RAS}$. This is called "GATED CAS operation", and the $\overline{CAS}$ would not run by itself. In accordance with any arbitrary Y-address information that is taken in, such time activation of $\overline{CAS}$ is repeated, in which cycle after a first arbitrary memory cell has been accessed, while the $\overline{RAS}$ is maintained at the "0" level, that is, at the activated state, the $\overline{CAS}$ is reset and after a predetermined period has elapsed the $\overline{CAS}$ is again transferred to the "0" level, the memory cells arrayed in the respective columns can be accessed at a higher speed than in the conventional RAS/CAS cycles. In addition, in the heretofore known page mode cycles, it is necessary to externally feed column address for CAS cycles in each CAS cycle. Whereas, according to the present invention, there is provided a novel memory structure which is simple and practically available without necessitating to feed column addresses in the CAS cycles in a page mode.

The essence of the present invention resides in that a shift register is assembled in a column decoder in a two-phase clock multi-address type RAM and it is made possible to access to memory cells allotted with consecutive column addresses at a high speed by effectively utilizing the shift function of this shift register. Since in the process of access in a practically used system the probability of accessing to consecutive addresses is very high and the occurence of such accesses is also extremely high, owing to the above-described memory structure the memory device according to the present invention can achieve greatly remarkable effects and advantages as compared to the heretofore known RAM. More particularly, in the memory device according to the present invention, upon RAS/CAS cycles, at first any arbitrary address information is taken in, and as soon as a memory cell is accessed, Y-address information is taken in a shift register. Thereafter, when the operation transfers to a page mode relying upon only the $\overline{CAS}$ clock, a shift clock is generated as synchronized to the $\overline{CAS}$ clock only, and thereby shift of the Y-address taken in during the RAS/CAS cycles is commenced. The shift of the address information controlled by the shift register is effected for each bit in response to a series of shift clock pulses generated in the respective cycles of the $\overline{CAS}$ clock. As a result, in the access to the memory in such a page mode, always consecutive addresses can be accessed without the Y-address information obtained by being taken in through a Y-address buffer as is the case with the prior art memory, and the time required for obtaining the Y-address information can be completely eliminated. Therefore, the present invention can bring about remarkable effects and advantages that quite novel functions which were not present in the page mode in the prior art are produced and high-speed access is made possible. Moreover, even in the case of not employing a page mode, the functions of the heretofore known RAM are not deteriorated at all.

Figure 2:
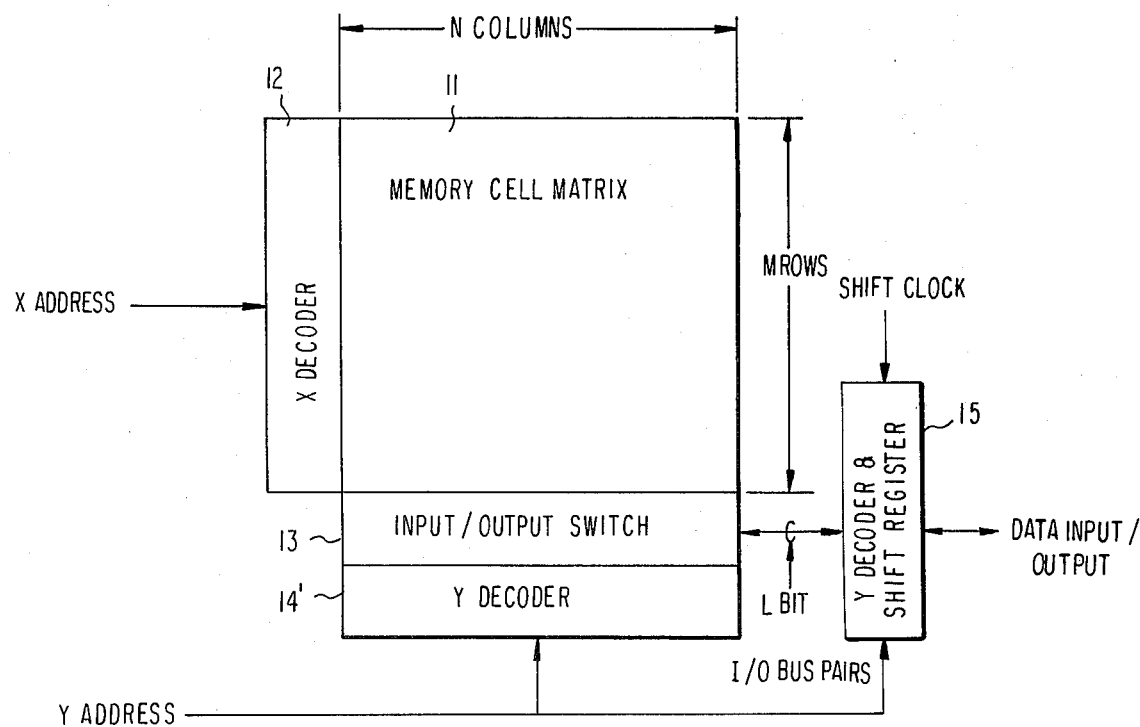
Figure 3:
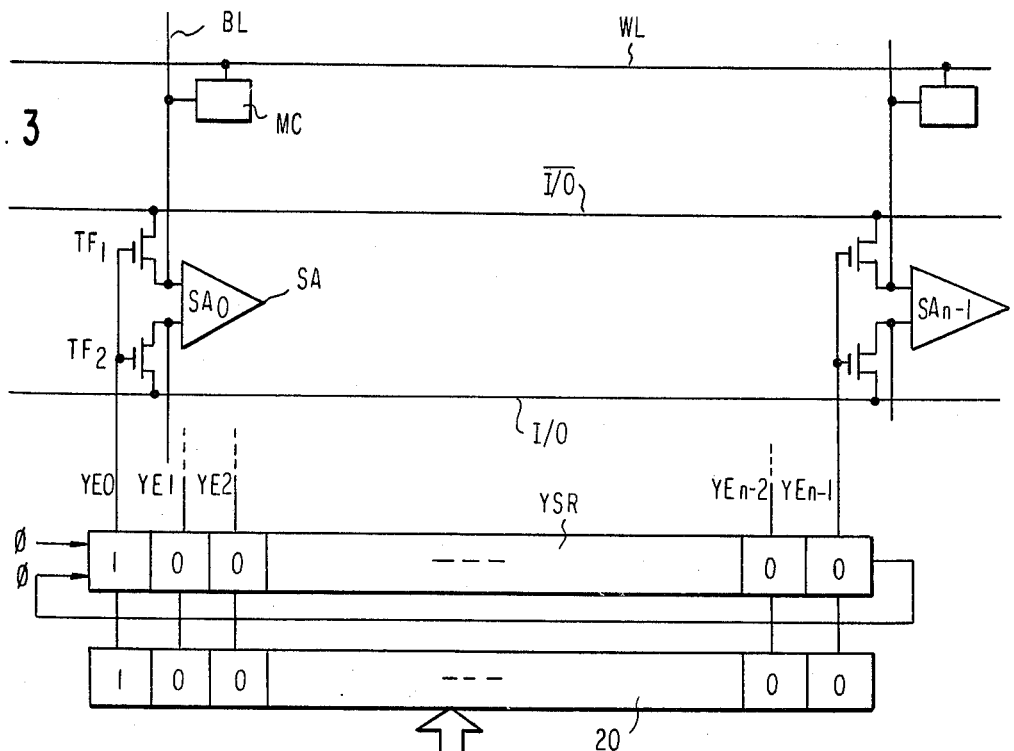
Figure 4:
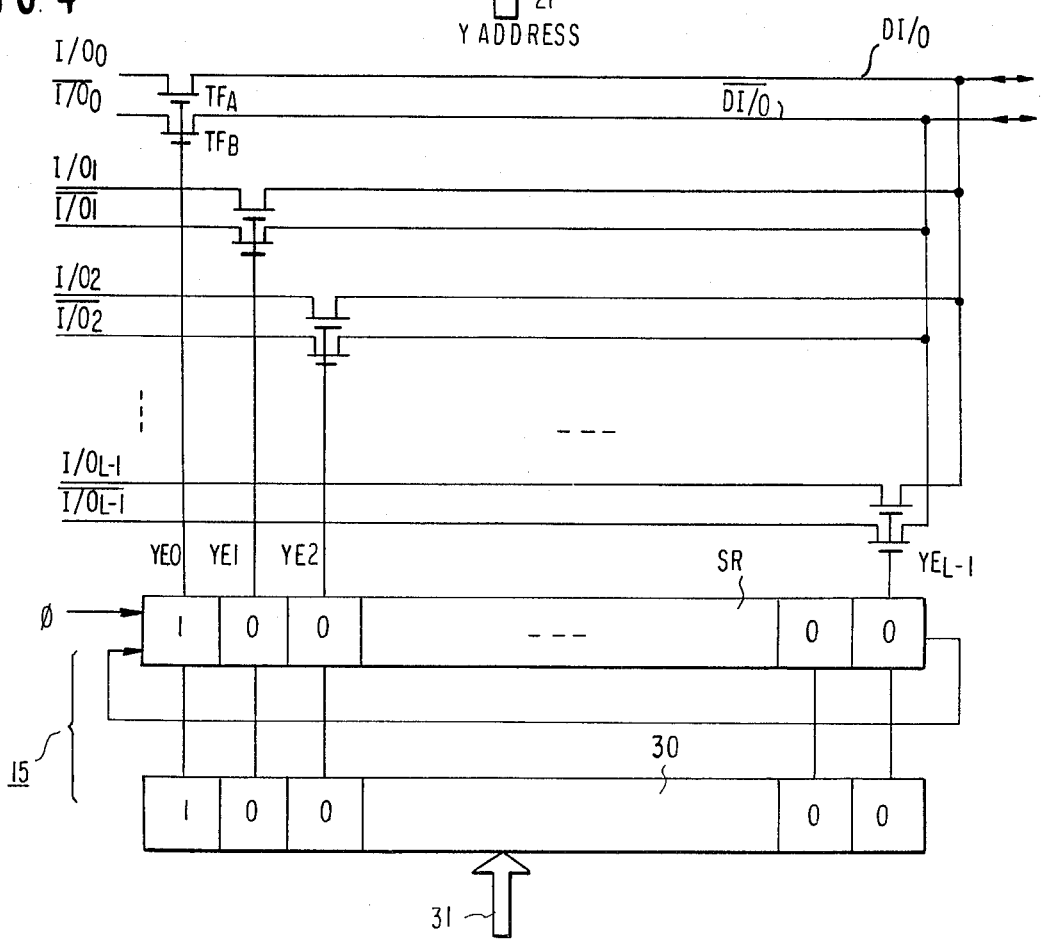
Figure 5:
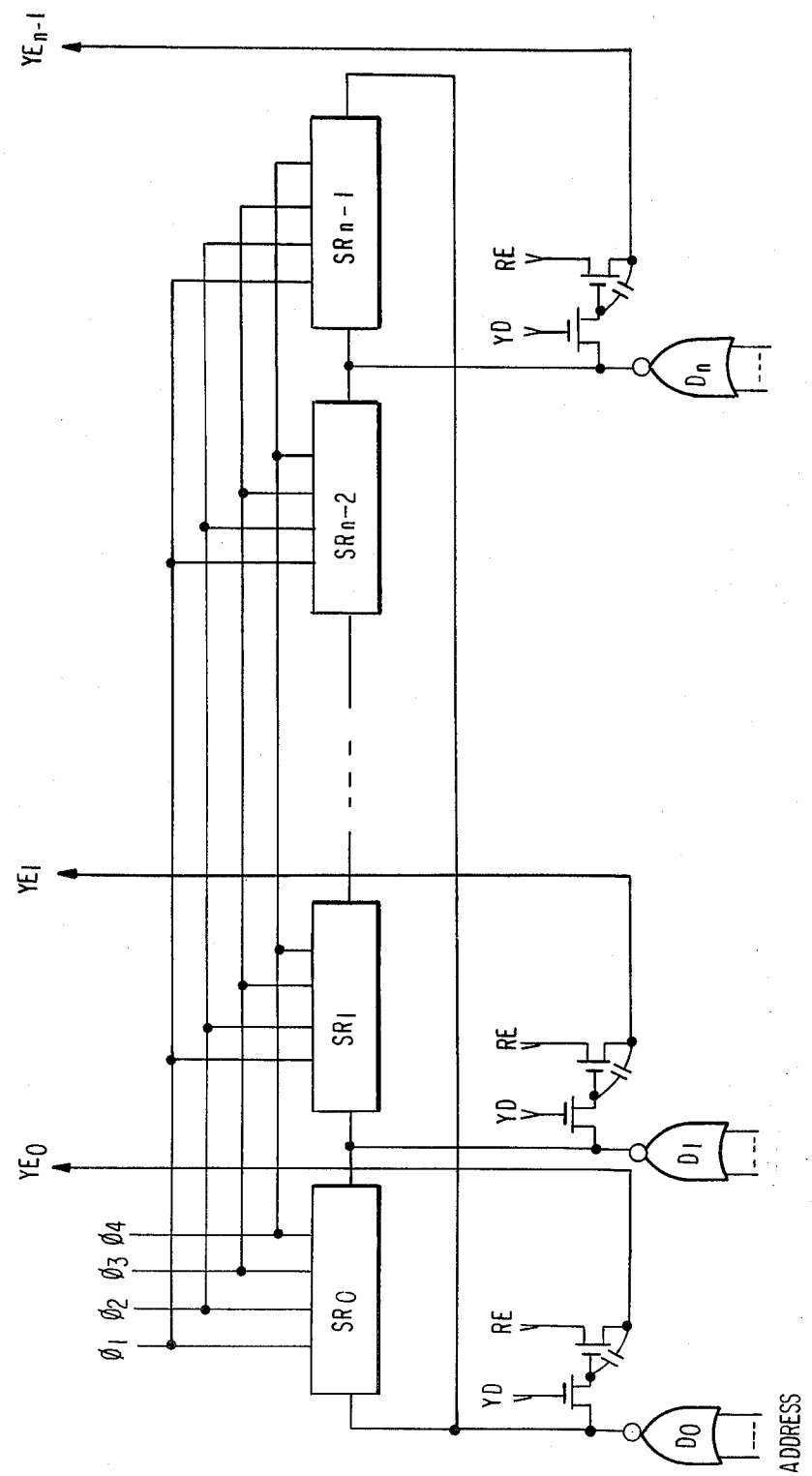
Figure 6:
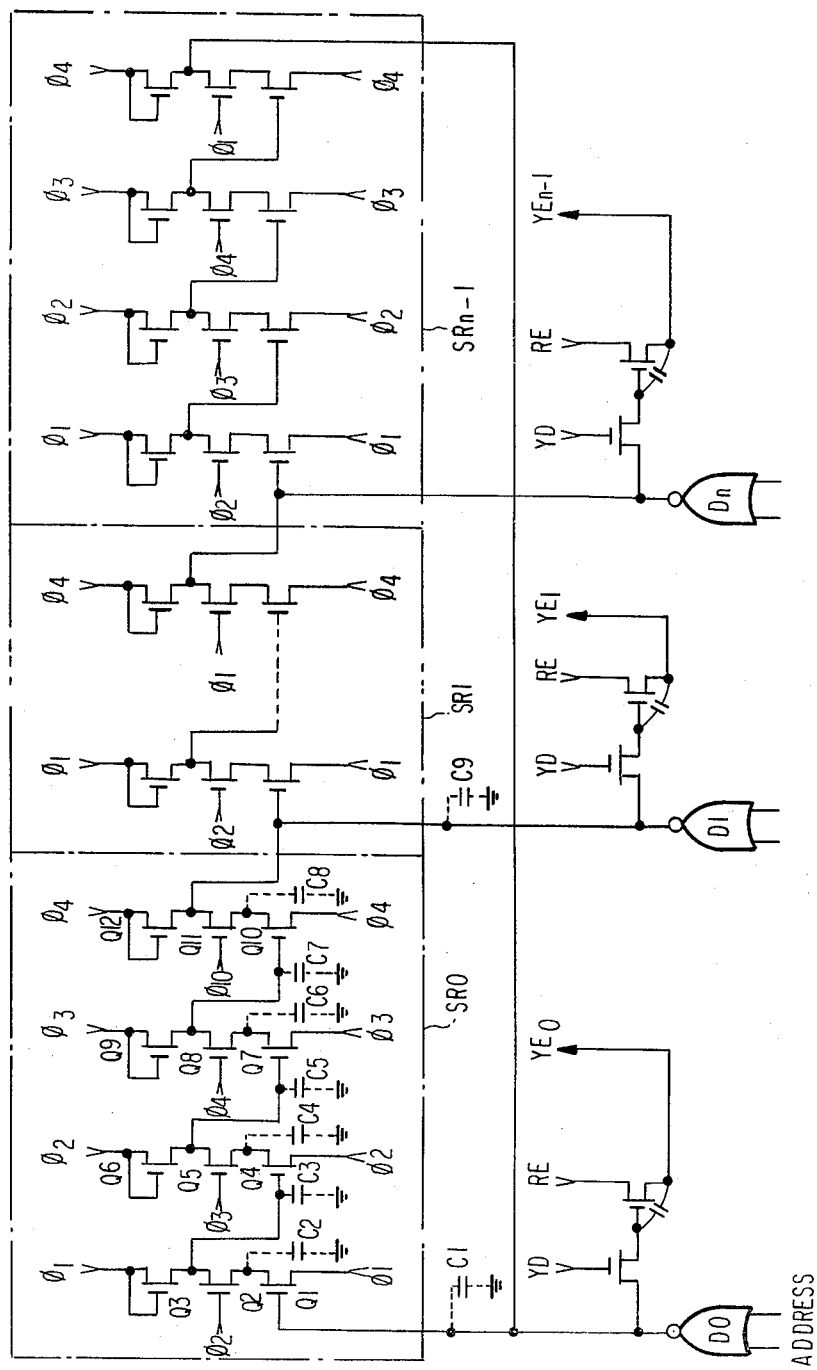
Figure 7:
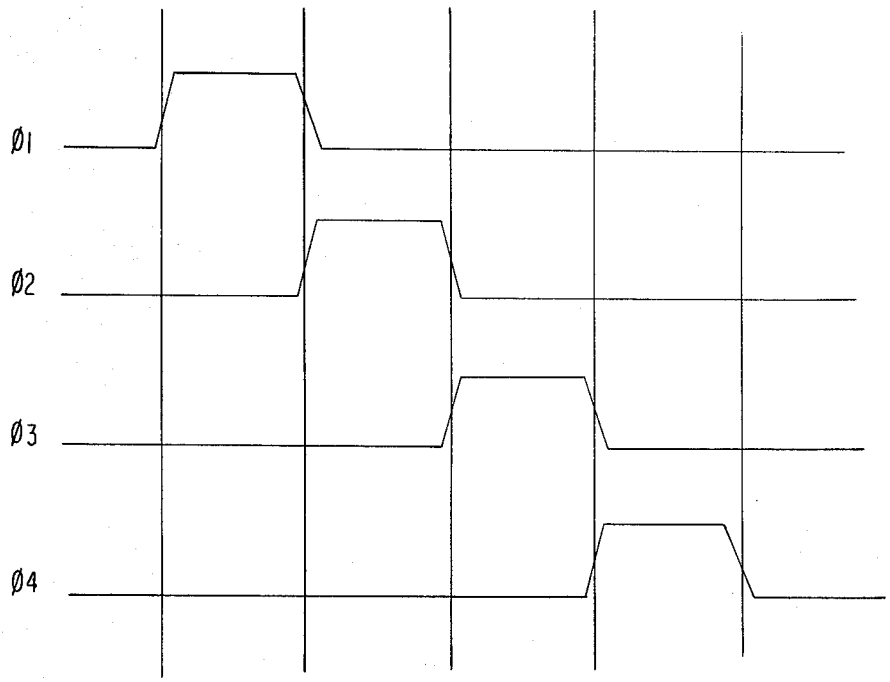
Figure 8:
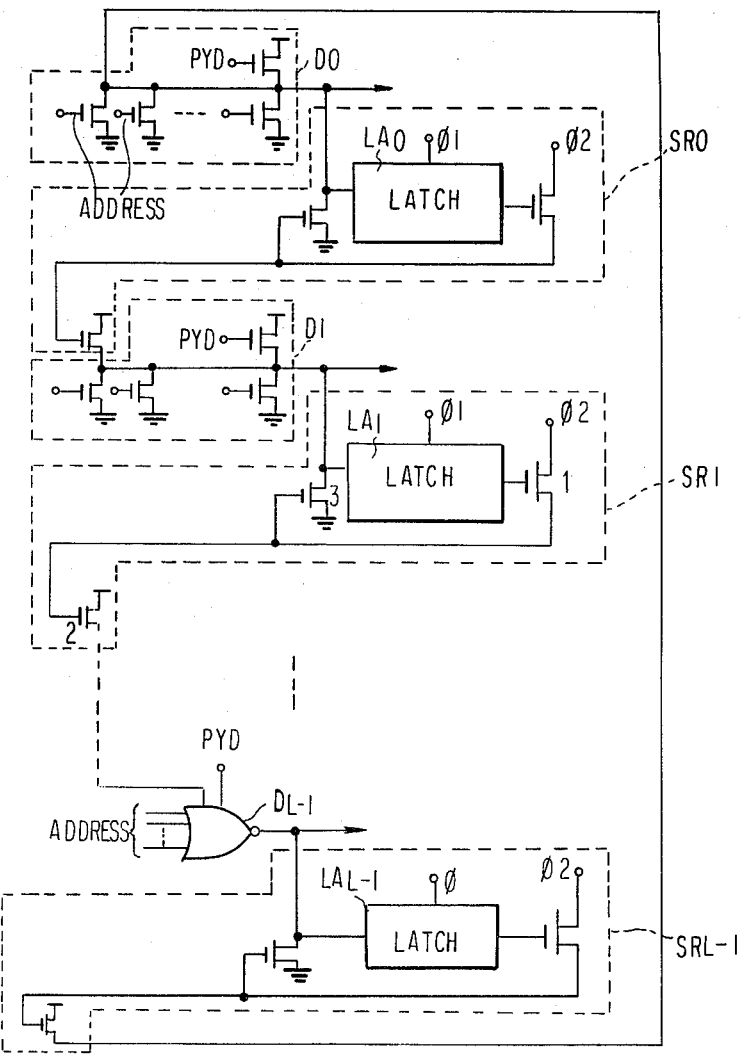
Figure 9:
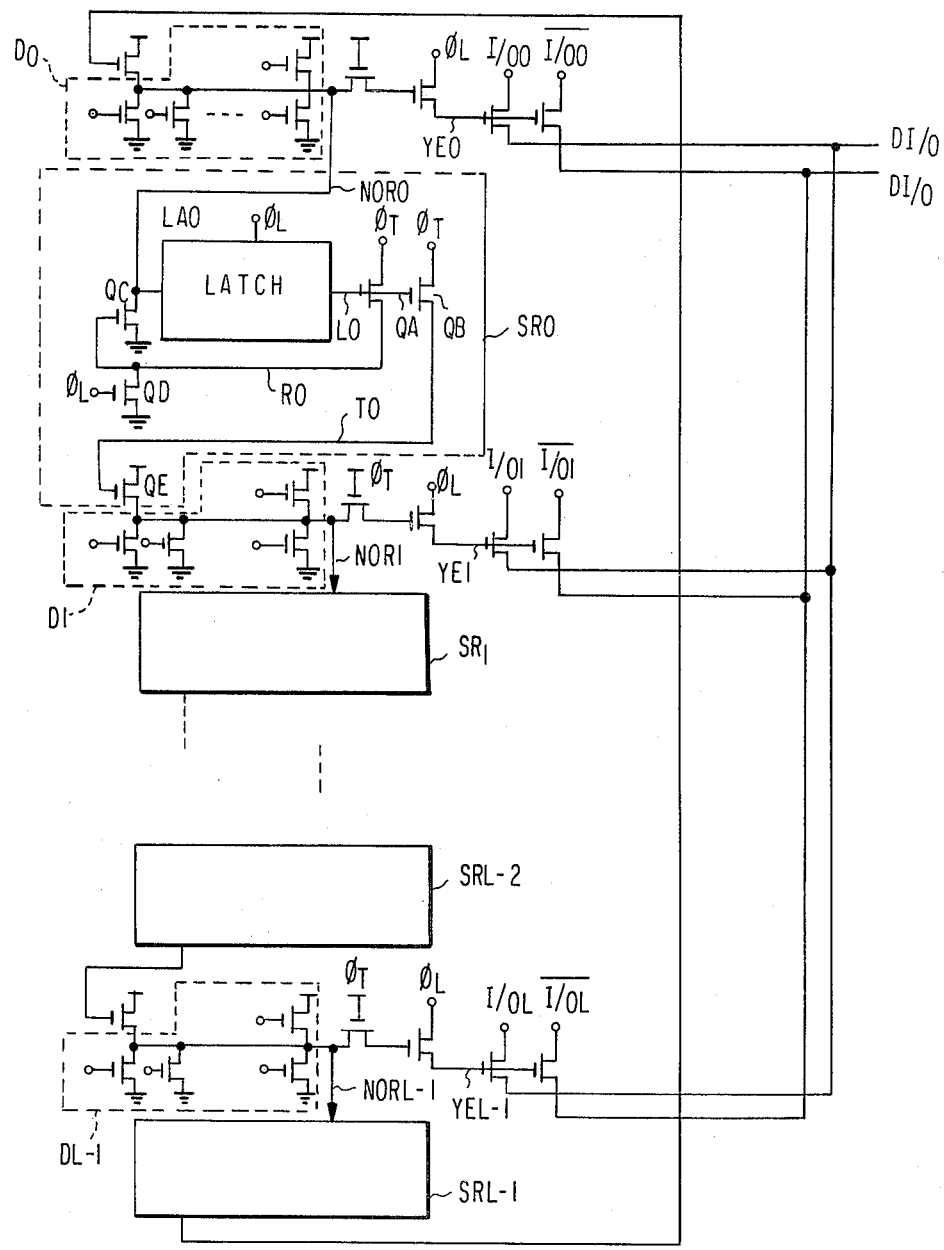
Figure 10:
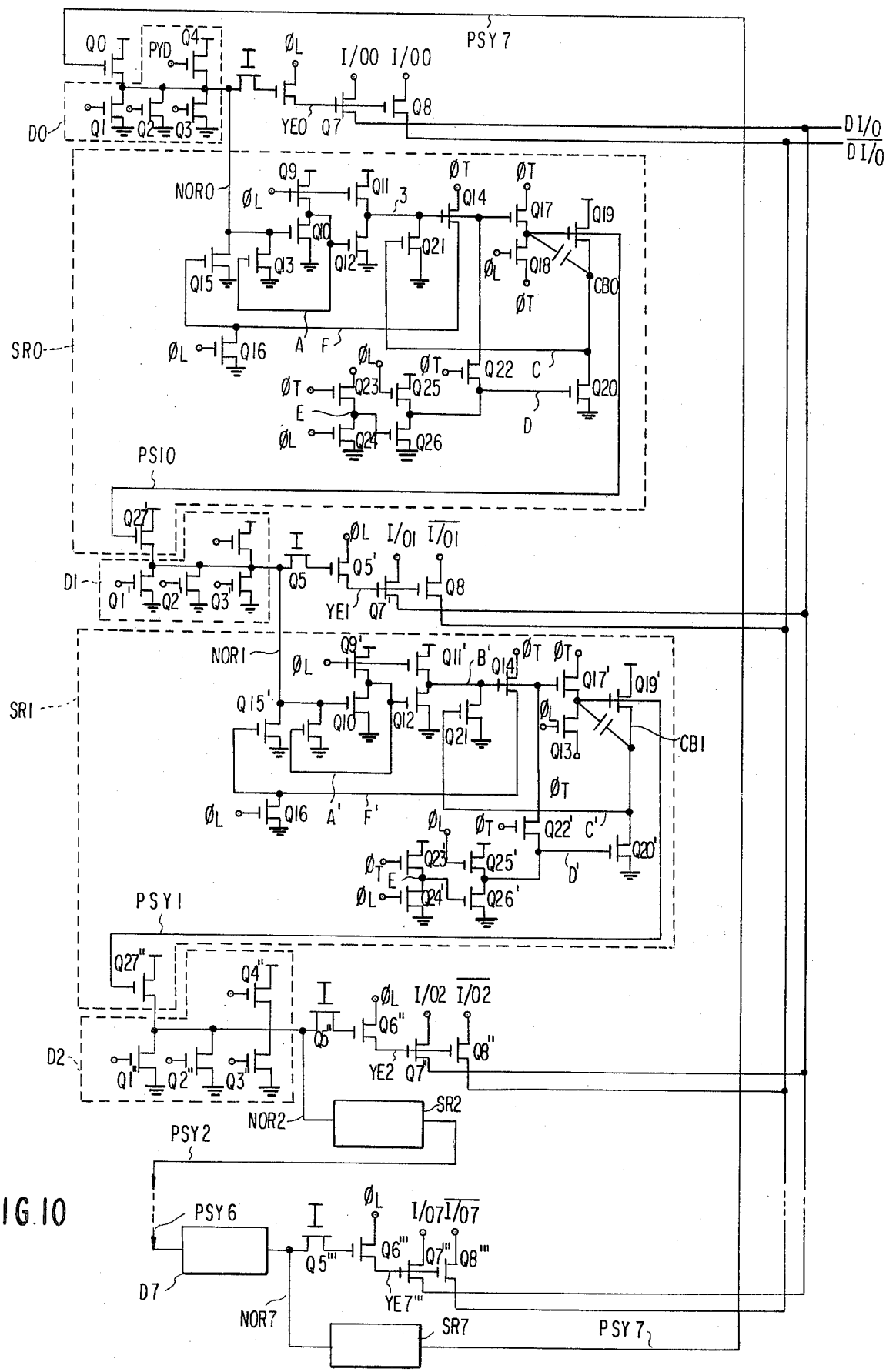
Figure 11:
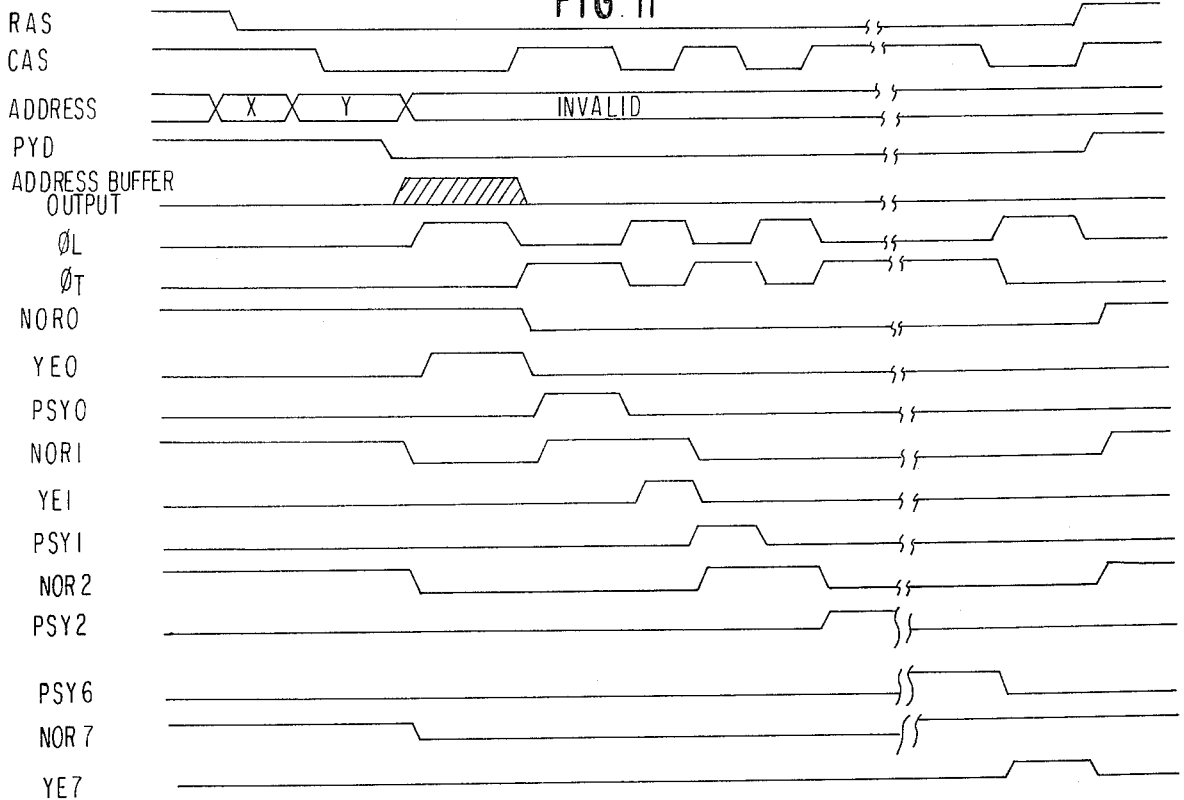
Figure 12:
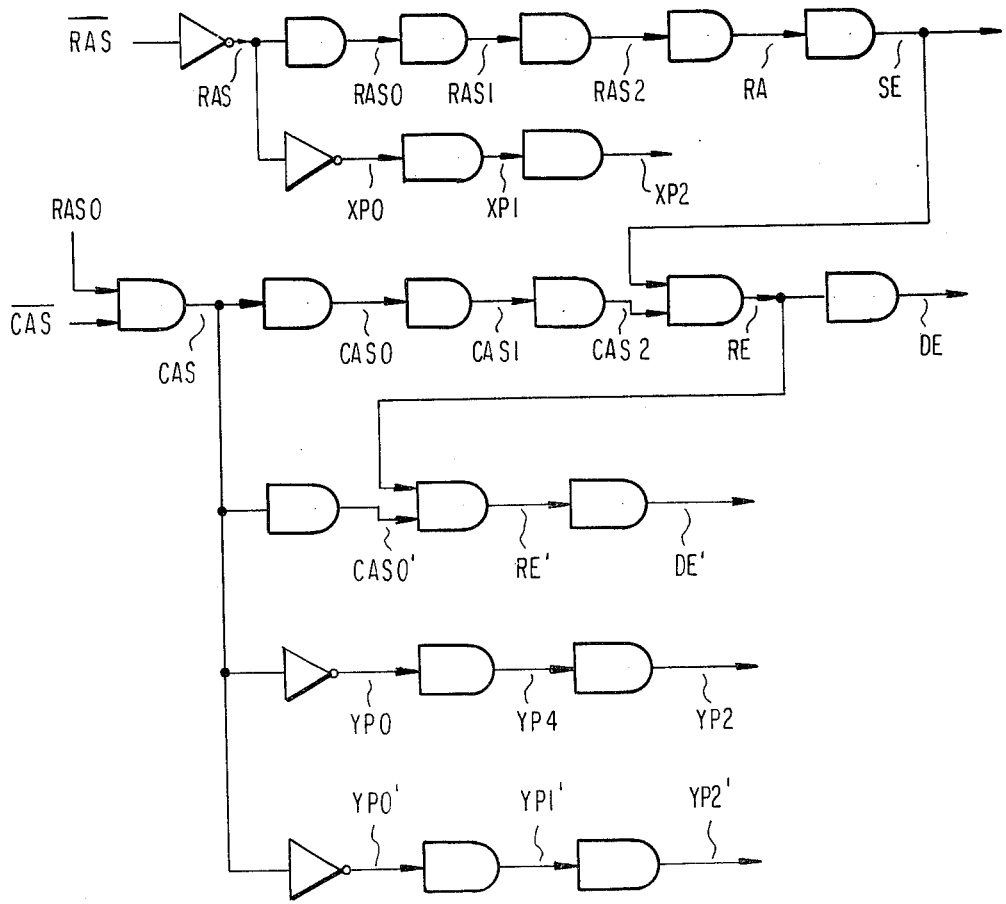
Figure 13:
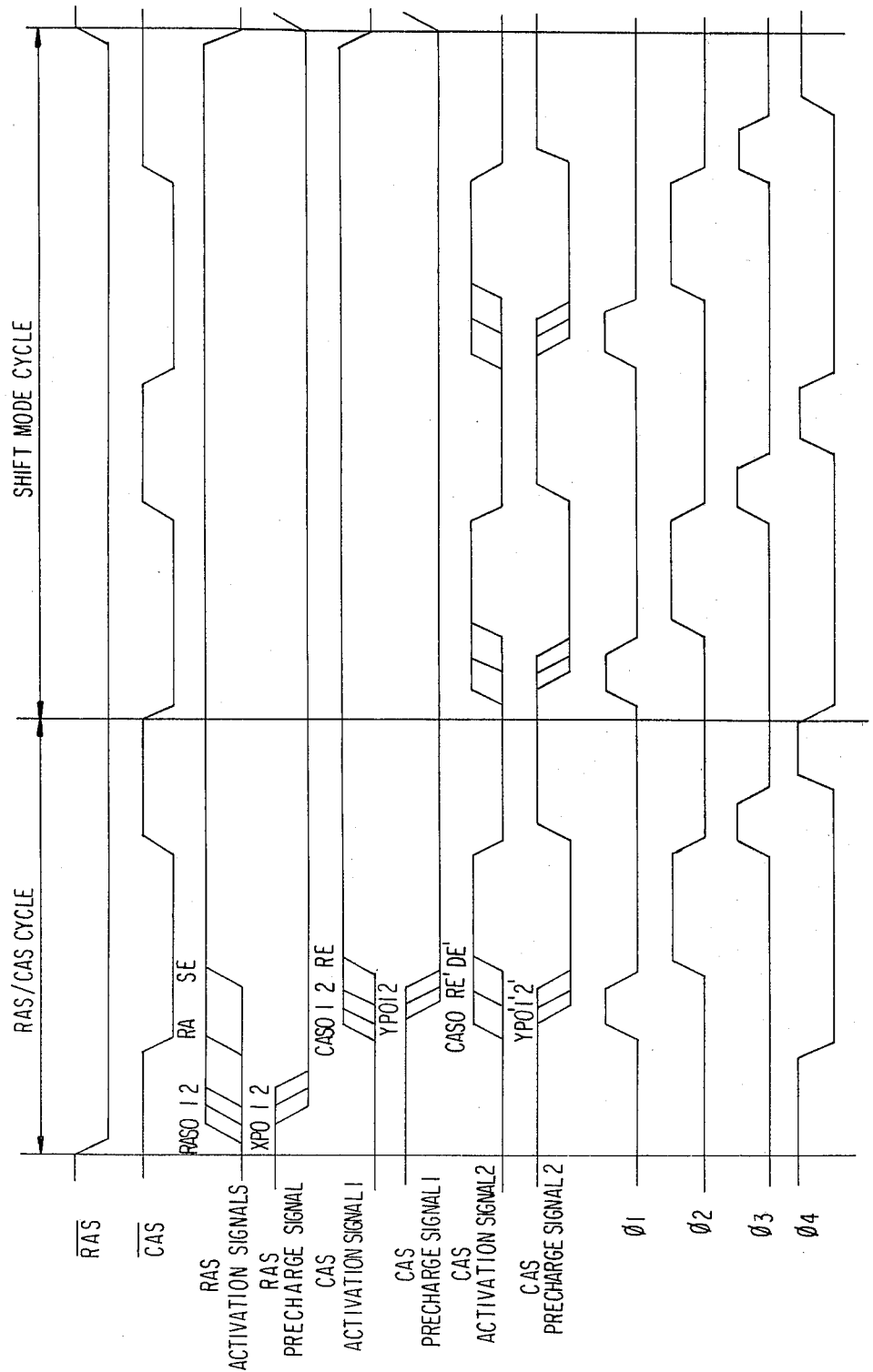
Figure 14:
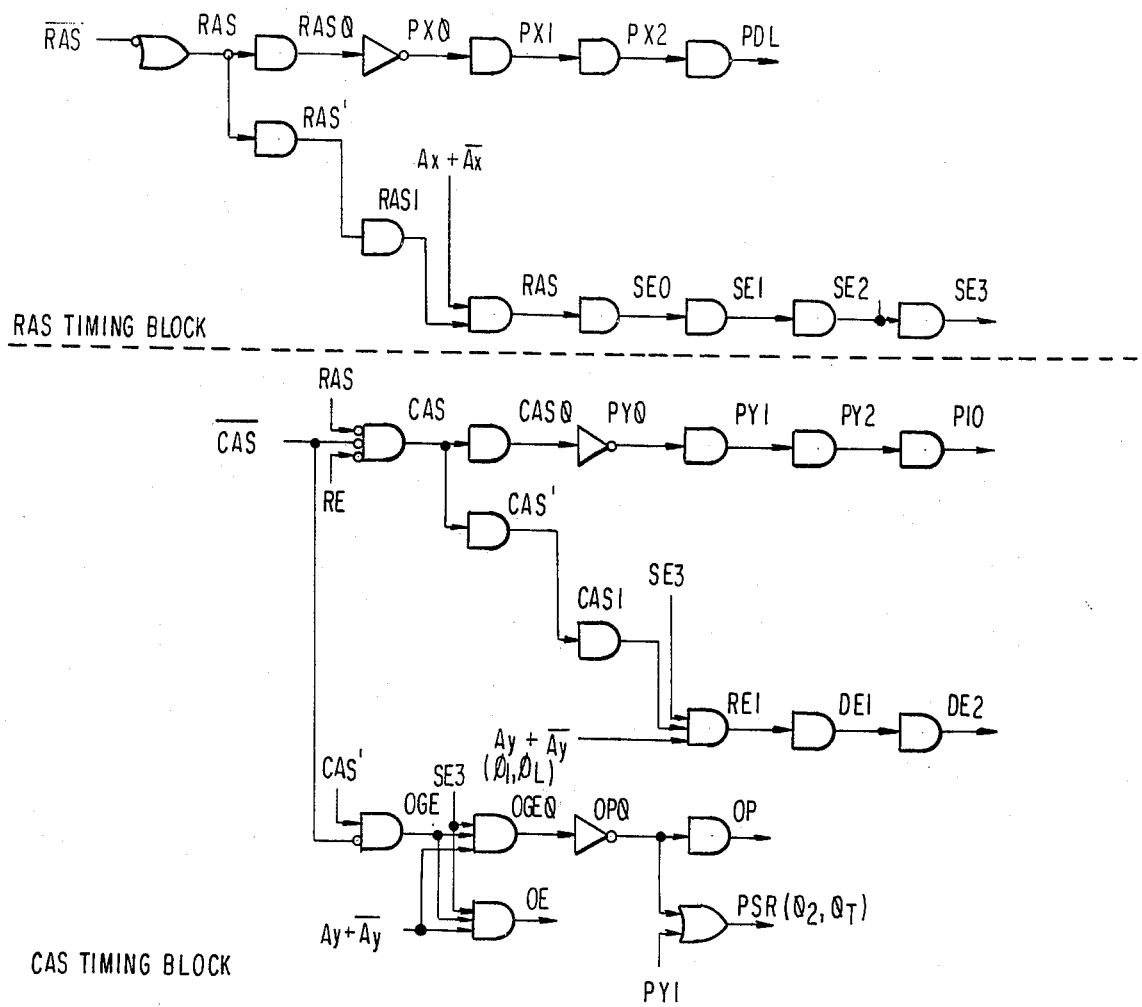
Figure 15:
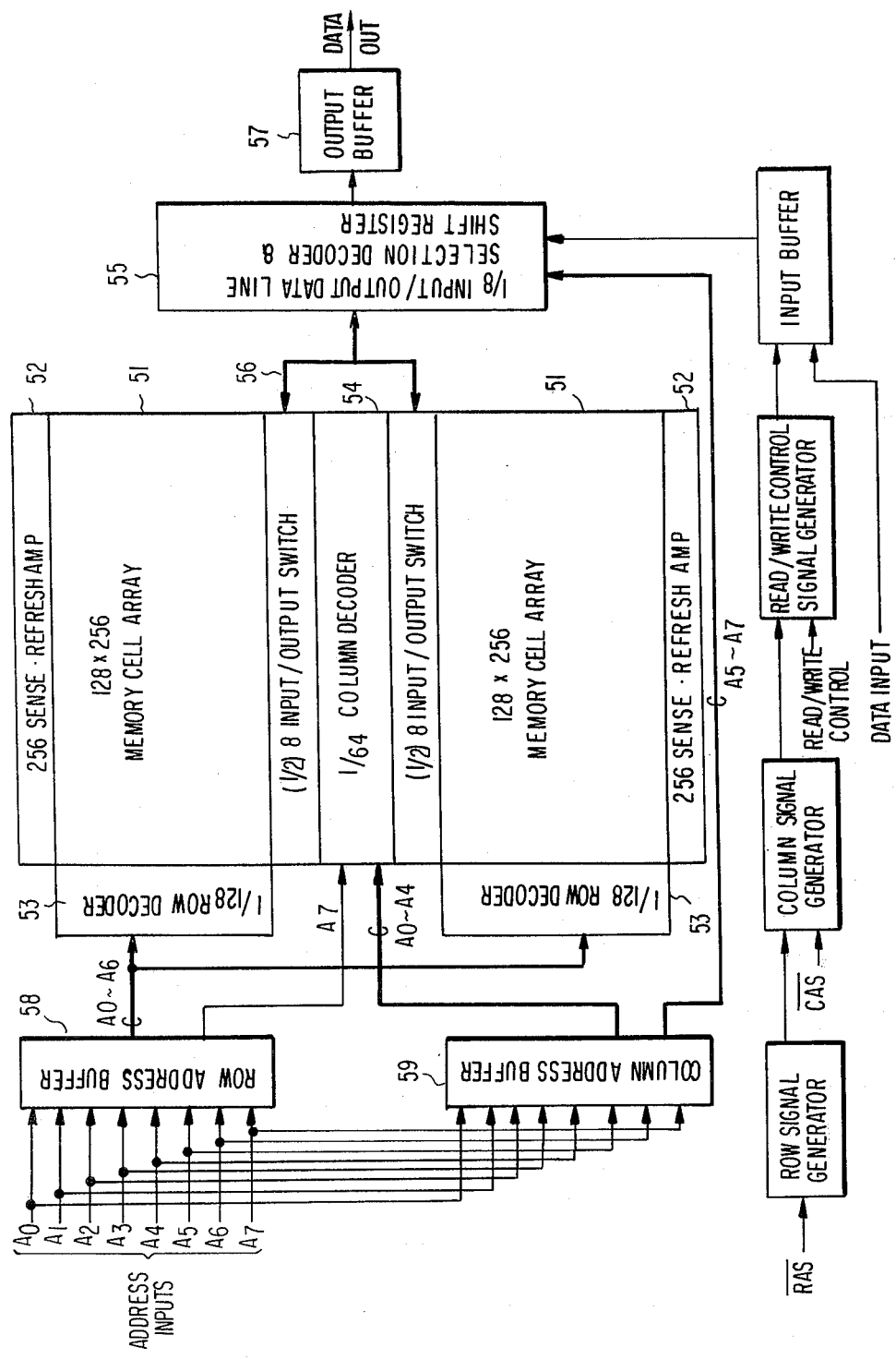
Figure 16:
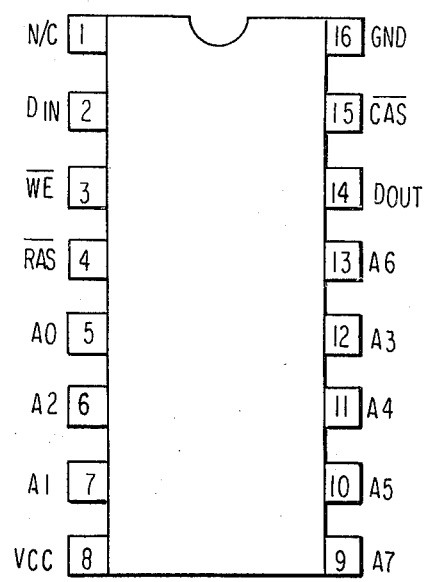
Figure 17:
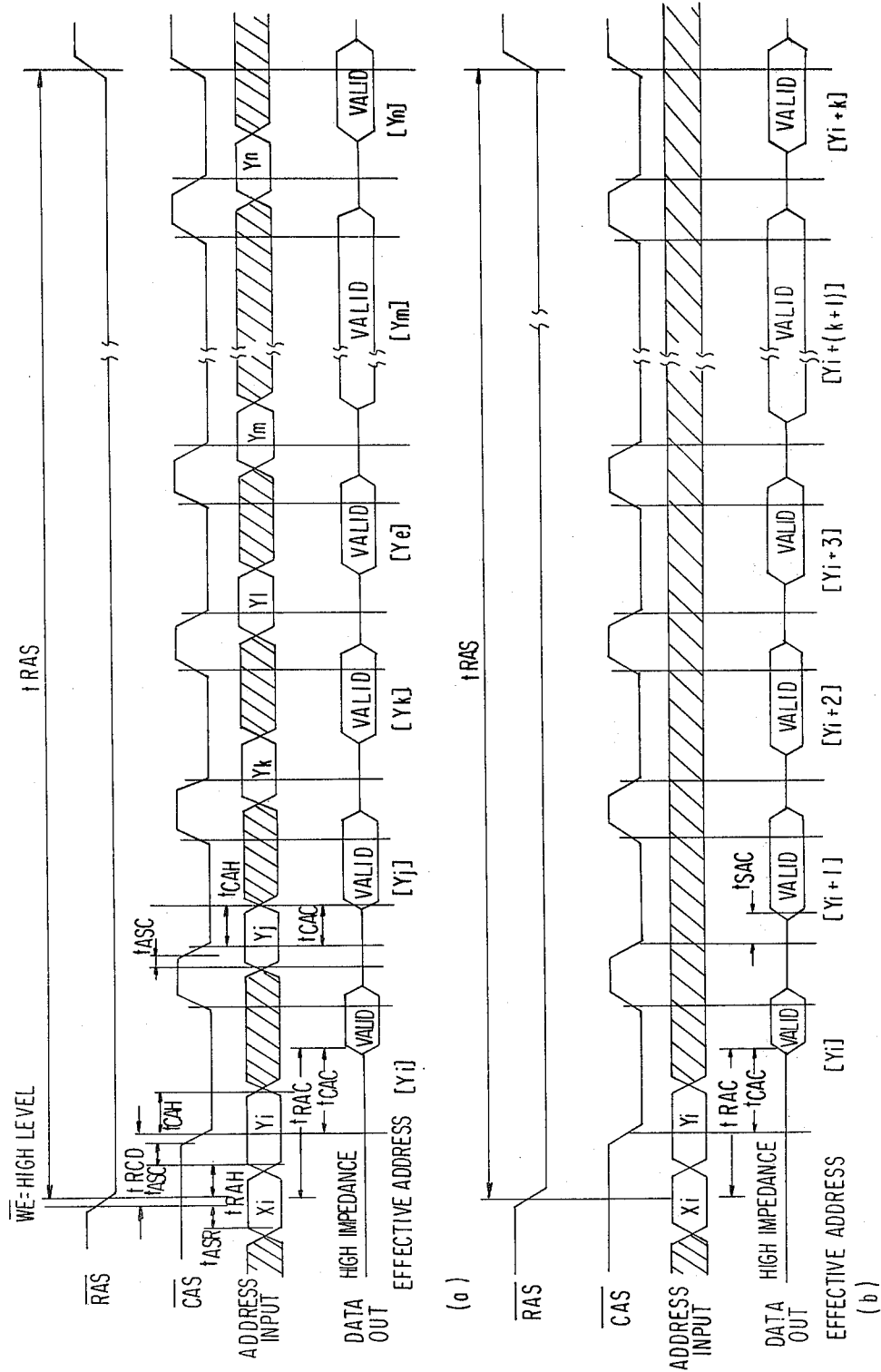

The above-mentioned and other objects, features and advantages of the present invention will become more apparent by reference to the following description of preferred embodiments of the invention taken in conjunction with the accompanying drawings, wherein:

FIG. 1 is a block diagram showing one basic construction of the memory device according to the present invention, FIG. 2 is a block diagram showing another basic construction of the memory device according to the present invention, FIG. 3 is a block diagram showing a drive system for a shift register in the memory device illustrated in FIG. 1, FIG. 4 is a block diagram showing a drive system for a shift register in the memory device illustrated in FIG. 2, FIG. 5 is a block diagram showing a construction of a decoder associated with a shift register, FIG. 6 is a circuit diagram showing a detailed construction of a decoder associated with a shift register employing a four-phase drive system, FIG. 7 is a waveform diagram showing a four-phase clock to be used in the circuit shown in FIG. 6, FIG. 8 is a block diagram showing a construction of a decoder associated with a shift register adapted to be driven by a two-phase clock, FIG. 9 is a block diagram showing a memory drive system employing a decoder associated with a shift register adapted to be driven by a two-phase clock, FIG. 10 is a circuit diagram showing the construction of the memory drive system shown in FIG. 9 in greater detail, FIG. 11 is a waveform diagram showing operation waveforms in the circuit shown in FIG. 10, FIG. 12 is a a schematic block diagram showing a construction of a timing generator in the case where one preferred embodiment of the present invention employing a four-phase drive shift register is applied to the conventional multi-address type RAM in the prior art, FIG. 13 is a waveform diagram showing timing waveforms generated by the timing generator shown in FIG. 12, FIG. 14 is a block diagram showing a timing generator in one preferred embodiment of the present invention which employs a two-phase shift register, FIG. 15 is a block diagram of the memory device according to the present invention as applied to a 16-pin multi-address type 64K words X 1 bit RAM, FIG. 16 is a schematic plan view showing an arrangement of pins in the 16-pin RAM shown in FIG. 15, and FIGS. 17 (a) and 17 (b) are waveform diagrams illustrating a difference in timing waveforms between the heretofore known page mode cycles and novel "shift mode" cycles in the novel type of RAM shown in FIG. 15.

In the followings, the present invention will be described in greater detail with reference to the accompanying drawings, and at first, a basic structure of a memory device according to the present invention will be explained with reference to FIG. 1, in which one example of a RAM of (M rows X N columns) words X 1 bit is illustrated. The present invention can be practiced in any type of RAM's employing any multi-address system, whether the RAM may be static type or dynamic type, and in the latter case whether the RAM may employ a single-phase clock multi-address system or a two-phase clock multi-address system. In the following description, it is assumed that the RAM employs a two-phase clock multi-address system. In the RAM, memory cells are arrayed in a matrix 11 of M rows X N columns, and the row and column of the matrix 11 are selected by an X-decoder 12 and a Y-decoder 14, respectively. To the X- and Y-decoders 12 and 14 are fed address data from X- and Y-address buffers (not shown). When one decoder output among M decoder outputs of the X-decoder 12 is energized, one row of word line coupled to this selected decoder output is selected and energization is simultaneously made to N memory cells connected to this selected word line, so that the data stored in these memory cells are transmitted to N sense amplifiers. The Y-decoder 14 has the function of selecting one of the N memory cells selected according to the X-address and carrying out switching to an input/output circuit. Thus, externally the memory device looks like a RAM of M rows X N columns) word X 1 bit. Furthermore, the Y-decoder 14 has a shift register assembled therein. This shift register has the function of taking in and temporarily holding the Y-address information determined in the first RAS/CAS cycle, and carrying out transfer bit by bit in response to a transfer clock generated in synchronism with the $\overline{CAS}$ clock only when the memory device is put in a page mode controlled only by the $\overline{CAS}$ clock. Accordingly, generation of a new address is effected by the shift register assembled in the Y-decoder without effecting the transfer of address information from the address buffer to the Y-decoder by the action of the address buffer, so that access to the RAM can be made faster than in the heretofore known page mode. It is a matter of course that when the RAKM does not operate in the page mode, it can achieve exactly the same function as the conventional RAM.

Another basic construction of the memory device according to the present invention is illustrated in FIG. 2. In this modified construction, the address signals fed from the Y-address buffer are divided into two parts, and one part of the address signals is fed to a Y-decoder 14' to select L-bit data among the N-bit data for the memory cells selected by the X-address and to transfer an input/output switch 13 for transmitting the respective L-bit data to L pairs of I/O buses. The other part of the address signals is fed to another Y-decoder 15 provided with a shift register function to select one arbitrary pair among the L pairs of I/O buses. Furthermore, when the operation is switched to a page mode, the shift register is operated by shift clock pulses which are generated each time the $\overline{CAS}$ clock pulse is input thereto to successively select one bus pair among the L pairs of I/O buses which were selected according to the Y-address information that was decided in the first RAS/CAS cycle and taken into the Y-decoder 14'. According to this system, access can be started from any address among the L-bit addresses, and any bits of consecutive addresses can be accessed so long as the number of bits is smaller than L. In addition, as a matter of course, it is possible to access to L' bits which is larger than L bits, provided that the condition of $L' \leq N$ is fulfilled. The modified circuit construction illustrated in FIG. 2, is not different at all in the basic operations from the first preferred embodiment described previously with reference to FIG. 1.

FIG. 3 shows the first preferred embodiment in FIG. 1 in greater detail, in which a Y-decoder 20 associated with a shift register YSR, single-transistor type memory cells MC and sense amplifiers SA. A simple register operation will be described in the following. At the trailing edge of the RAS clock the X-address signal is latched, and when the X-address buffer operates, address binary codes are produced. These signals are fed to the X-decoder, in which one decoder output from one decoder unit is selected among the M decoder outputs. As a result of the selection of the X-decoder, one word line is selected, hence memory cells connected to the selected word line are energized, and subsequently the memory cell informations are transmitted to sense amplifiers SA to be amplified. Thereafter, at the trailing edge of the $\overline{CAS}$ clock a Y-address signal 21 is latched, and thereafter a series of operations occur sequentially in the Y-address buffer (not shown) and the Y-address decoder 20. Thus, one bit selected by the Y-decoder 20 among the N-bit memory cell information selected by the X-decoder, is transferred to an input/output bus I/O via transfer gates $TF_1$ and $TF_2$. With regard to the decision for selection by the decoder, normally design is made such that in the memory circuit an internal MOS high level (logic level of "1") may appear for a selected decoder unit, while an internal MOS low level (logic level of "0") may appear for an unselected decoder unit. Accordingly upon decision for selection by the Y-decoder 20, the N-bit Y-decoder 20 takes the state where only one decoder unit of one bit presents "1" and the remaining decoder units present "0", and this state is taken in and held by the shift register YSR in the first RAS/CAS cycle. Thereafter, when the operation in switched to a page mode, a shift clock synchronized with the $\overline{CAS}$ clock is generated, and subsequently, the shift register YSR starts transfer of data one bit by one bit. Thereby the selection and unselection in the Y-address decoder are determined only by the data held in the shift register YSR, and hence so long as only the timing of the transfer in response to the shift clock is well regulated, the operation of the Y-address buffer can be omitted, so that the proposed novel decoder construction can achieve remarkable effects in the shortening of the access time in the heretofore known page mode.

FIG. 4 shows the construction of the Y-decoder 15 associated with a shift register SR included in the arrangement shown in FIG. 2. This Y-decoder 15 selectes one of L pairs of input/output buses I/O$_0$, $\overline{I/O_0}$—I/O$_{L-1}$, $\overline{I/O_{L-1}}$ to connect it to a pair of data buses D I/O, $\overline{D I/O}$. The function of the shift register SR itself is not different at all from that of the shift register SR shown in FIG. 3, and basically the operations of these shift registers are exactly the same. Reference symbols TF$_A$ and TF$_B$ designate transfer gate transistors controlled by a decode output YE$_0$. According to the above-mentioned system, since the memory cell information has been already transferred to the L pairs of input/output fuses in accordance with the Y-address information taken in, at the first RAS/CAS cycle, in the subsequent page mode the data transfer time to the input/output bus becomes unnecessary in contrast to the system according to the previously described embodiment, and hence this modified embodiment has the merit that the access time in a page mode is further shortened.

FIG. 5 shows a circuit construction of a decoder associated with n-bit shift register (SR$_0$, SR$_{n-1}$) to be employed according to the present invention. Generally, a decoder for a MOS dynamic RAM employs a NOR logic structure. With regard to the shift registers, those relying upon a two-phase clock system or a four-phase clock system are generally used, and the shift register can be constructed by employing either one of the above clock systems. The register of the four-phase clock system has such advantages that various clocks can be generated and also any clock suitable for the use can be generated because a clock generator is provided within the device and that a power consumption is generally small. The following description will be made in connection to the case where the register of the four-phase clock system is employed. A four-phase drive register operates generally to repeat the cycle consisting of take-in, evaluation, hold and transfer of data. Accordingly, in the case of incorporating the shift register in the decoder circuit, it is only necessary to drive the register by providing a control circuit which takes n data into the register after the decision by the decoder and which generates a group of four-phase clocks $\phi_1$—$\phi_4$ after commencement of the next memory cycle and before the next decision by the decoder. More particularly, the decoder associated with the shift register provided according to the present invention operates in the following manner. When the address decoder unit D$_0$ is selected in the first RAS/CAS cycle, the NOR output node of the decoder unit D$_0$ becomes "1", and all the remaining decoder units D$_1$—D$_{n-1}$ become "0".

Thereafter, the data at the outputs of the respective NOR gates D$_0$—D$_{n-1}$ are latched by the corresponding stages SR$_0$—SR$_{n-1}$ of the shift register. In this instance, only the column select signal YE$_0$ is made selective level while the remaining column select signal YE$_1$—YE$_{n-1}$ are kept at non-selective level. Therefore, data amplified by a sense amplifier associated to the column select signal YE$_0$ is transferred to input/output bus lines through transfer gates such as denoted as TF$_1$ and TF$_2$ of FIG. 3. Subsequently, when the operation is switched to a page mode, the drive of Y-address buffer is inhibited and the all the NOR gates D$_0$—D$_{n-1}$ are disenabled thereby to make all the NOR output nodes in a floating state.

At the same time, a set of shift register drive clocks $\phi_1$—$\phi_4$ are generated in synchronism with the energization of $\overline{CAS}$, so that the shift register starts its shift operation. In this shift operation, selective level latched by the stage SR$_0$ is transferred to the subsequent stage SR₁ of the shift register. Thus, the column select signal YE₁ is energized. In this instance, the stage SR₀ is changed to the non-selective level by the data shift from the stage SR$_{n-1}$, and the other stages SR₂—SR$_{n-1}$ remain non-selective level. The mentioned shift operation of the shift register is continued per each of the energization of $\overline{CAS}$. Thus, the selective level is shift from the stage SR₀ towards the stage SR$_{n-1}$ one bit by one bit, and the column shift signal is energized from YE₀ to YE$_{n-1}$, step by step. Here if provision is made such that the clock in charge of "transfer" among the shift register drive clock group $\phi_1$—$\phi_4$ may be generated at the same time with the start of the $\overline{CAS}$ clock, then a remarkable effect can be expected in shortening the heretofore known page mode access time because the time required for driving the address buffer in the prior art can be omitted. Furthermore, since it is clear that the decoder would access to the next address in the next page mode cycle, it is also possible to make provision such that the NOR mode of the Y-decoder has been decided upon inputting the $\overline{CAS}$ clock, and hence it is possible to achieve further high-speed access.

FIG. 6 shows one practical example of a decoder in which a four-phase drive shift register is assembled, and the operation of the decoder will be explained hereunder with reference to the shift register drive clock waveforms illustrated in FIG. 7. It is assumed now that in the first RAS/CAS cycle, a Y-address decoder unit D₀ has been selected according to the Y-address information. Accordingly, the NOR nodes of the respective decoder units take "1" level for the decoder unit D₀ and "0" level for the decoder units D₁—D$_{n-1}$, and the information of these levels serve as input information to the shift register. At this moment, when a clock $\phi_1$ comes in, transistors Q₃ included in the respective shift register stages SR₀—SR$_{n-1}$ are turned ON, so that a transistor Q₁ in the register stage SR₀ is turned ON and charges a capacitor C₂. However, the transistors Q₁ in the other register stages SR₁—SR$_{n-1}$ are turned OFF. Also a transistor Q₃ in the register stage SR₀ is turned ON and charges a capacitor C₃. When a clock $\phi_2$ comes in, as the transistors Q₁ and Q₂ both become ON, the charge on the capacitor C₃ is discharged through the transistors Q₁ and Q₂, and hence the gate of a transistor Q₄ becomes the ground potential. In addition, a transistor Q₆ is turned ON and charges a capacitor C₅. When a clock $\phi_3$ comes in, since the transistor Q₄ is held OFF because of the ground potential at its gate, the charge on the capacitor C₅ flows into the capacitor C₄ through the transistor Q₅, so that the voltage across the capacitor C₅ is maintained at a value determined by the capacitance ratio between the capacitors C₄ and C₅. The capacitance ratio between the capacitors C₄ and C₅ is set at such value that the transistor Q₇ can be well turned ON. Then the transistors Q₇ and Q₉ are turned ON, so that the capacitors C₆ and C₇ can be charged. When a clock $\phi_4$ comes in, a transistor Q₈ is turned ON, and the transistor Q₇ is held ON because its gate is maintained at a high potential by the charge stored on the capacitor C₅, so that the charge on the capacitors C₆ and C₇ is discharged through the transistors Q₇ and Q₈, and the potential on the capacitor C₇ is brought to the ground potential. In addition, provision is made such that the NOR node of the decoder unit D₁ may be precharged before the clock $\phi_4$ comes in. As described above, by means of the four-phase clocks the outputs of the n decoder units D₀—D$_{n-1}$ have been taken in as input information of the n shift register stages SR₀—SR$_{n-1}$ and have been transferred to just before the register stages corresponding to the decoder units at the next addresses. Subsequently to the first RAS/CAS cycle, when the operation is switched to a page node controlled only by the $\overline{CAS}$ clock, the operation of the address buffer is inhibited. Only the information taken in and held in the preceding cycle is transferred to the next shift register stages as controlled by the transfer clock $\phi_1$, and thereby the state of the decoder is determined. In the case of accessing to consecutive addresses in a memory device in a page mode, the association of a shift register with a decoder allows to omit the operation of the address buffer in the above-described manner, and therefore it becomes possible to provide a quite novel memory device having a highly excellent performance which was not found in the heretofore known page mode. While the above description was made in connection to one example employing a shift register driven by four-phase clocks, the present invention can be realized even by employing a shift register driven by two-phase clocks, and whatever type of circuit construction of a shift register could be employed.

In FIG. 8 is illustrated one example of a decoder having a shift register function according to a two-phase clock system, and a practical circuit construction of the decoder is shown in FIG. 9. In FIG. 8, a decoder unit D₀ has a NOR gate construction in which address binary signals are input in a selected combination. A latch circuit LA₀ is activated by a clock $\phi_1$ and holds a decoder output YE₀. Subsequently, in synchronism with a clock $\phi_2$ the decoder output YE₀ held by the latch circuit LA₀ is transmitted to a gate of a pull-up transistor 83 in the next shift register stage SR₁ via a transistor Q₂₁ and is also applied to a reset transistor Q₈₂ of the latch circuit LA₀ to reset the latch circuit LA₀. In this way, the output of the shift register (SR₀—SR$_{L-1}$) is shifted in synchronism with the clocks $\phi_1$—Q₂ one stage by one stage for each period of the clocks.

In FIG. 9, the basic construction of the decoder associated with a shift register shown in FIG. 8 is applied to an I/O bus pair selector circuit for a memory circuit having a plurality of I/O bus pairs which is explained with reference to FIG. 4. Transistors Q$_A$ and Q$_B$ for producing transmission signals on the basis of the decoded information YE$_i$ stored at the latch circuit output node upon transfer of the decoded information to the next decoder stages in responce to a second clock $\phi_T$ after the decoded information has been taken into the latch circuits in response to a first clock $\phi_L$, are provided as two separate independent transistors, one (Q$_A$) resetting the selected decoder unit output node to the ground potential immediately after commencement of the transfer, the other (Q$_B$) selectively charging the next stage decoder unit output node. In the circuit of the former (Q$_A$) signal is provided a transistor Q$_D$ for resetting the raised potential at the node R₀ to the ground potential in response to the clock $\phi_L$ immediately after the transfer of the decoded information in response to the clock $\phi_T$. Thereby, improvements have been made in the operation margin for the shortening of a cycle in a consecutive access mode, that is, in a page mode.

Normally, clocks taking charge of principal functions such as latch, transfer, etc. have their operation amplitudes set at the power supply level. However, since the transfer operation in response to the clock $\phi_T$ according to the present invention is effected during the reset period of the $\overline{CAS}$ in the consecutive access mode, if the reset period of the $\overline{CAS}$ becomes extremely short, the selective charging will become so insufficient that the potential at the output node of the next stage decoder unit cannot be raised sufficiently. Therefore, there arises a risk that a non-selection condition of the decoder may be generated. Therefore, in order to overcome this shortcoming, the well-known boot-strap effect is utilized, upon potential rise of an information transmission signal the potential rise is effected quickly by this acceleration effect to attain a sufficient potential in a short period, and thereby the operation margin has been further improved. On example of such improved circuits is shown in FIG. 10.

The operation of the above-referred embodiment of the present invention illustrated in FIG. 10 will be described in detail with reference to the timing wave forms appearing in the operation as illustrated in FIG. 11. While a 8-bit construction is employed in the following description of the operation, it is obvious that upon practicing the present invention the number of bits is not limited to 8 bits, and either increase or decrease of the number of bits would not bring about any disadvantage in the basic operation of the illustrated embodiment. In general, a decoder for a RAM employs a NOR logic construction. In FIG. 10, each of decoder units $D_0, D_1, \ldots D_7$ is composed of three transistors $Q_1$ to $Q_3$ which are OR-connected for address binary codes and a load transistor $Q_4$ subjected to control by a clock PYD. When address information has been taken in the first RAS/CAS cycle, address binary codes are generated by an address buffer, and before the address binary codes are transmitted to the address decoder, the clock PYD transfers from "1" level to "0" level, and thereby precharge is completed.

Thereafter, depending upon the received address binary codes, decision by the address decoder is effected. When the decoder unit $D_0$ has been selected, the NOR output node $NOR_0$ of that decoder unit $D_0$ is maintained at "1" level, and the NOR output nodes $NOR_1$—$NOR_7$ of the other unselected decoder units $D_1$—$D_7$ all transfer to "0" level. In response to a subsequently produced clock $\phi_L$, a node YE0 is raised via transistors $Q_5$ and $Q_6$, transfer gate transistors $Q_7$ and $Q_8$ are controlled by the potential on the node YE0, and thereby the information on the selected I/O bus pair $I/O_0$, $\overline{I/O_0}$ is transmitted to the data bus pair D I/O, $\overline{D I/O}$. During a normal RAS/CAS cycle, the clock $\phi_L$ is synchronized with the clock adapted to control the transfer gate transistors for transmitting the memory cell information amplified by the sense amplifiers on the basis of an output of another decoder, then provision is made such that these clocks may rise almost at the same time as that the clock $\phi_L$ may not precede, and thus contrivance is made such that the increase of an access time during the RAS/CAS cycle may not be prevented.

In addition, the same clock $\phi_2$ also takes charge of latching the Y-address information during the RAS/CAS cycle. More particularly, a two-stage dynamic inverter connected at a predetermined parameter ratio which consists of transistors $Q_9$ to $Q_{12}$ forms a latch circuit with the aid of the drive by the clock $\phi_L$, so that the decoded address information is stored at a node marked Ⓑ. The basic operation of this latch circuit is as follows. It is now assumed that the decoder unit $D_0$ has been selected in the RAS/CAS cycle. Accordingly, the NOR output nodes of the respective decoder units are at logic "1" level for the decoder unit $D_0$ and at logic "0" level for all the decoder units $D_1$—$D_7$, and there logic levels serve as input information for the shift register. After the decision by the respective decoder units, when the clock $\phi_L$ has been produced, the shift register stage SR0 connected to the selected decoder unit $D_0$ starts a latch operation. In response to the information "1" fed from the selected decoder unit $D_0$, the transistor $Q_{10}$ is turned ON, so that a node marked Ⓐ is brought to "0" level as decided by a given parameter ratio between the transistors $Q_9$ and $Q_{10}$, in response to this "0" level the transistor $Q_{12}$ is turned OFF, and the node Ⓑ is charged up to the level of $V_{DD}$—$V_T$ ($V_T$ being a threshold voltage of the MOS transistor) because the transistor $Q_{11}$ controlled by the clock $\phi_L$ is turned ON. The level of the clock $\phi_L$ is selected at the $V_{DD}$ level in order to raise the charge-up level of the node Ⓑ as high as possible.

Even in the case where normal RAS/CAS cycles continue, this latch circuit can latch or renew the selection or unselection information of the decoder unit without affecting the decoder unit at all. More particularly, in the case where the decoder unit $D_0$ is selected in the first RAS/CAS cycle and subsequently another decoder unit is selected in the next RAS/CAS cycle, the potential change at the decoder information storing node Ⓑ in the shift register stage SR0 is as follows. At first, when the decoder unit $D_0$ has been selected, the subsequently produced latch clock $\phi_L$ starts a latch operation in response to the selection, and the node Ⓑ is charged up to the level of $V_{DD}$-$V_T$. When the decoder unit $D_0$ has become unselected in the next RAS/CAS cycle, the node $NOR_0$ becomes "0" level and turns the transistor $Q_{10}$ OFF, so that the node Ⓐ is charged up to the level of $V_{DD}$-$V_T$ by the clock $\phi L$. Thereafter, immediately the transistor $Q_{12}$ is turned ON, and hence it discharges the charge stored at the node Ⓑ. Even if a discharging transistor subjected to control by the clock PYD is provided between the node Ⓑ and the ground potential and the discharge of the stored charge at the node Ⓑ is effected by this discharging transistor upon each resetting of the RAS/CAS cycle without relying upon the latching clock $\phi_L$ in the next cycle, the basic operation of the above-mentioned shift register would not be deteriorated. In addition, at this moment, in the shift register stage SR1 connected to the other unselected decoder unit $D_1$, for example, a transistor $Q'_{10}$ is turned OFF and a transistor $Q_{12}'$ is turned ON, so that the charge at the decoder information storing node Ⓑ' is held discharged by the clock $\phi_L$, and thus "0" level can be maintained.

So long as the RAS/CAS cycles continue, the latch and renewal operations of the decoded information would be carried out within the shift register, but thereafter if the operation is switched to a consecutive access mode, that is, to a page mode controlled only by the $\overline{CAS}$ clock, then the transfer clock $\phi_T$ is generated immediately after the resetting of the $\overline{CAS}$ to commence the transfer operation during the reset period of the $\overline{CAS}$.

Let us now consider the case where the decoder unit $D_0$ is selected and the other decoder units $D_1$—$D_7$ are kept unselected in the RAS/CAS cycle just prior to the switching to a consecutive access mode, that is, a page mode, and thereafter the operation is switched to the consecutive access mode. At this moment, the decoded information is latched by the clock $\phi_L$ in the RAS/CAS cycle, so that the node Ⓑ in the shift register stage SRO is held at "1" level, while the nodes corresponding to the node Ⓑ within all the other shift register stages including the node (B) within the shift register stage SR1 are held at "0" level. When the transfer clock $\phi_T$ produced immediately after resetting of the $\overline{CAS}$ comes in, since the node (B) is held at "1" level a transistor $Q_{17}$ is turned ON and commences to charge up a boot-strap capacitor $CB_0$. Since the clock $\phi_T$ is applied to the drain of the transistor $Q_{17}$, owing to the boot-strap effect by the drain-gate parasitic capacitances of the transistor $Q_{17}$ and a transistor $Q_{14}$ whose gate is connected to the node (B), when the clock $\phi_T$ rises the potential at the node (B) rises from $V_{DD}$-$V_T$ up to a level higher than the power supply level $V_{DD}$, and thereby accelerates the charging of the boot-strap capacitor $CB_0$ through the transistor $Q_{17}$. The charged level and charging time of the charging of the boot-strap capacitor $CB_0$ through the transistor $Q_{17}$ are controlled respectively by a conductance ratio between transistors $Q_{19}$ and $Q_{20}$ and a delay circuit constructed by transistors $Q_{23}$—$Q_{26}$. After an appropriate delay time decided by the parameters of the delay circuit has elapsed, that is, when a node (E) rises in response to ride of the clock $\phi_T$ and a node (D) transfers from the level of $V_{DD}$-$V_T$ to "0" level in response thereto, the transistor $Q_{20}$ is turned OFF and opens a node (C) to which one end of the boot-strap capacitor $CB_0$ is connected so that the potential at the node (C) can rise, and hence a node $PSY_0$ commences to rise quickly exceeding the power supply level owing to the well-known boot-strap effect, turns a transistor $Q_{27}$ ON and thereby charges a NOR output node $NOR_1$ of the decoder unit $D_1$ which is adjacent to the decoder unit $D_0$ selected during the RAS/CAS cycle.

The transistor $Q_{22}$ acts the role of switching the potential at the node (B) from "1" level to "0" level to turn OFF the transistor $Q_{17}$, for the purpose of preventing reverse flow of charge from the node $PSY_0$ to the clock $\phi_T$ caused by the turning ON of the transistor $Q_{17}$ when the node $PSY_0$ is raised to a potential higher than the power supply level by the generation of the boot-strap effect. Since the node (C) rises up to the power supply level in accordance with the potential rise at the node $PSY_0$, the transistor $Q_{21}$ further promote the potential change at the node (B) which is caused by the turning ON of the transistor $Q_{22}$. The transistor $Q_{18}$ causes the stored charge on the boot-strap capacitor $CB_0$ to be discharged by means of the latch clock $\phi_L$ which is generated during an activation period of a consecutive access mode to which the operation is switched after transfer of decoded information during the reset period of the $\overline{CAS}$, and thereby switches the potential at the node $PSY_0$ to "0" level. On the other hand, in the shift register stages SR1—SR7 connected to the unselected decoder units $D_1$—$D_7$, all the decoded information storing nodes including, for example, the node (B') in the shift register stage SR1, are maintained at "0" level. Accordingly, transistors $Q_{14}'$ and $Q_{17}'$ are held OFF, charging of the boot-strap capacitor caused by application of a transfer clock $\phi_T$ is not effected, and potential rise at the node $PSY_1$ cannot be observed. As described above, owing to the application of a transfer clock $\phi_T$, the decision of either selection or unselection of decoder units in a consecutive access mode is effected according to a quite novel system not found in the prior art, that is, it is effected by selective charging of decoder NOR output nodes by means of a transfer clock $\phi_T$.

The transistor $Q_{14}$ acts the role that upon transfer of decoded information to the next decoder stage controlled by the clock $\phi_T$, it raises the potential at a node (F), and in response thereto it turns ON the transistor $Q_{15}$ to switch the selection information of the preceding decoder stage of "1" level to "0" level and to turn the selected decoder unit to an unselected state. The transistor $Q_{16}$ restores the potential at the node (F) which has been switched to "1" level at this moment, to "0" level during the activation period in preparation for the next cycle.

In the unselected decoder units, since selective charging by the nodes $PSY_i$(i=0—7) is not effected in this consecutive access cycle, the NOR output nodes of the unselected decoder units become floating "0" potential, hence becomes liable to be influenced by external noises or the like. Hence, there is a risk of bringing about multiple selection of the decoder units. The transistor $Q_{13}$ has the function that upon unselection of a decoder unit, it feeds back the output of the dynamic inverter consisting of the transistors $Q_9$ and $Q_{10}$ which operate in response to "0" level at the decoder NOR output node, receives the logic "1" level at the node A which has risen in potential, and thereby fixedly holds the decoder NOR output node at the ground potential. In this way, the flip-flop formed by the transistor $Q_{10}$ and the transistor $Q_{13}$ by feeding back the potential at the output node of the inverter, stably maintains the NOR output node of the unselected decoder at the ground potential owing to the fast that the node (A) is charged in each cycle by the clock $\phi_L$ and thus held at the logic "1" level, and thereby serves to prevent occurrence of multiple selection. Here, for the purpose of assuring smooth operation of the flip-flop when the decoder unit switches from the unselected state to the selected state, the dimension of one transistor $Q_{13}$ forming the flip-flop is designed as small as possible. Accordingly, in the consecutive access cycle in which the decoder unit $D_0$ is selected, the output node $NOR_0$ rises in accordance with the rise of the node $PSY_7$ and quickly turns ON the transistor $Q_{10}$, hence the node (A) is restored to the ground potential. Therefore, the transfer operation in response to the clock $\phi_T$ can be achieved smoothly. In the RAS/CAS cycle, a decoder precharge clock $PY_D$ is generated during the reset period, hence all the decoder output nodes $NOR_i$(i=0—7) are charged up to the logic "1" level and the node (A) is also restored to the ground potential, and therefore, the logic "1" level at the node (A) would not bring about any hindrance in the latch operation of the shift register. The charging clock $PY_D$ for the respective decoder units is preset so as to exceed the power supply level, because the selective charging clocks $PSY_i$ upon consecutive access cycles rise higher than the power supply level and thus charge up the selected decoder unit to the power supply level. In addition, provision is made such that the address buffer which feeds address binary codes serving as a decoder input, is inhibited from operation in a consecutive access mode.

The above-mentioned is a series of operations in the circuit illustrated in FIG. 10. The decoder associated with a shift register according to the present invention can bring out an epock-making property of a memory device that a consecutive access cycle time is as small as 70 ms, owing to the facts:

that in the proposed circuit, by means of a latch clock $\phi_L$ generated in synchronism with the $\overline{CAS}$ in the RAS/CAS cycle, decoder selection/unselection information can be taken in a latch circuit formed of two stages of very simple inverters, renewal of latched information can be achieved without influencing the next stage so long as a transfer clock $\phi T$ is not applied, and hence upon switching to a consecutive access mode the operation can be continued smoothly and quickly;

that the activation period can be shortened because latching can be achieved in a very short period of time by a clock $\phi_L$ which is generated immediately at the following edge of the $\overline{CAS}$ in the consecutive access cycle and which serves both as a latch signal and as an I/O bus information transfer drive signal; and that the transfer clock $\phi_T$ generated immediately after resetting of the $\overline{CAS}$ passes through the shortest path from the transistor $Q_{17}$ to the transistor $Q_{27}$ in FIG. 10, and is accelerated by the intervening of the boot-strap circuit, and hence the decoded information can be transferred to the next stage in a short period of time.

A construction of a timing generator employed in the present invention is illustrated in FIG. 12, and timing waveforms appearing in this timing generator are illustrated in FIG. 13. The operation of the timing generator will be explained in the following with reference to these figures. In the illustrated example, description will be made in connection to the four-phase driven shift register shown in FIG. 6. When the $\overline{RAS}$ shifts from "1" level to "0" level and thereby the memory is activated, a timing signal RAS converted to an internal MOS level rises. In response to the RAS, precharge timings $XP_0$, $XP_1$ and $XP_2$ are reset, and $RAS_0$, $RAS_1$ and $RAS_2$ rise successively, so that a row address buffer responds to address information. Address binary codes are transmitted from the address buffer to a row decoder, and when a selection/unselection operation of the row decoder has been completed, a timing signal RA rises and a selected word line is driven to rise. Thereafter, in response to the RA, a timing signal SE rises, and when sense amplifiers are activated, the contents in N memory cells connected to the selected word line are amplified and refreshed. Then, the circuit operation in response to activation of the $\overline{RAS}$ has been finished. A first stage inverter to which the $\overline{CAS}$ is input, is designed so as to operate normally in response to an activation signal of the $\overline{RAS}$, for example, in response to a timing signal $RAS_0$ in order to assure the GATED CAS operation. Accordingly, activation of the $\overline{CAS}$ is effected only when the $RAS_0$ rises and also the $\overline{CAS}$ switches from "1" level to "0" level. Thereby, the CAS converted to the internal MOS level can rise. In response to the CAS, precharge timings $YP_0$, $YP_1$ and $YP_2$ are reset, and also $CAS_0$, $CAS_1$ and $CAS_2$ rise successively, so that a column address buffer responds to the address information. When the address binary codes were transmitted from the address buffer to the column decoder and selection/unselection operations in the column decoder have been completed, a timing RE rises, so that a digit line of a selected column is connected to a data input/output bus. In response to the RE, a timing DE rises, so that an output amplifier is activated, and memory cell information appearing on the data input/output bus is amplified and transmitted via an output buffer to an output terminal. Then the activation operation controlled by the $\overline{CAS}$ has been finished.

The above-mentioned is the explanation the operation of a principal internal circuit of a dynamic RAM of two-phase clock multi-address system. While the circuit system according to the present invention is similar to the heretofore known circuit system with respect to activation of the $\overline{RAS}$, improvements have been made in the subsequent activation of the $\overline{CAS}$. More particularly, when the $RAS_0$ rises in response to activation of the $\overline{RAS}$ and also the $\overline{CAS}$ is activated by switching from "1" level to "0" level, at first the CAS which has been converted to an internal MOS level, rises. Simultaneously with resetting of the precharge timings $YP_0$, $YP_1$ and $YP_2$ in response to the CAS, the $CAS_0$, $CAS_1$ and $CAS_2$ rise successively, and the column address buffer responds to the address information. When the address binary codes were transmitted from the address buffer to the column decoder and selection/unselection operations in the column decoder have been completed, the RE rises. On the other hand, in response to the rise of the CAS, a timing $CAS_0'$ rises simultaneously with the $CAS_0$, and in response thereto, a shift register drive clock $\phi_4$ is reset and another clock $\phi_1$ rises. The clock $\phi_4$ is a data latch clock for the last stage of the shift register, and also it carries out precharge. Although data latched in the preceding stage is transferred in response to rise of the transfer clock $\phi_1$ and thereby the data would appear at the NOR output node of the decoder, since the clock $YP_0$ is preset so that precharge of the decoder may not be finished in the first RAS/CAS cycle, even if the transferred data should be "0", it would be cancelled and thus mulfunction would not occur. Accordingly, the RE' which commences to rise in response to the $CAS_0'$, really commences to rise in response to rise of the RE which is preset to rise only in response to the fact that in the first RAS/CAS cycle, after the decision in the column address decoder and also after activation of the $\overline{RAS}$, amplification by the sense amplifiers has been well achieved. This means that the RE' preset so as to start rising after the selection/unselection operations in the column decoder controlled by the shift register have been completed, is also controlled by the RE analogously to that the $\overline{CAS}$ clock upon the RAS/CAS cycle is controlled by the RAS clock so as to prevent self-running of the $\overline{CAS}$. In other words, owing to such gated control, in the first RAS/CAS cycle, the timing of the RE' which serves to connect a digit line to a data input/output bus in response to the $CAS_0'$ which was separated from the $CAS_0$ for the purpose of generating a group of shift register drive clocks, can be controlled so as not to be advanced. When the RE' rises, the transfer clock $\phi_1$ is reset in response thereto, and the transfer is terminated. As a result of resetting of the clock $\phi_1$, the clock $\phi_2$ rises, the RE has already terminated its rising. Hence, it is possible to take the state of the column address decoder decided in the first RAS/CAS cycle into the register. The clock $\phi_2$ is preset so that it may maintain "1" level until the reset time of the $\overline{CAS}$ and may be reset in synchronism with the resetting of the $\overline{CAS}$. In addition, at this moment, the $CAS_0$, $CAS_1$, $CAS_2$ and RE maintain "1" level until they are reset by the $\overline{RAS}$. At the same time, a shift register drive clock $\phi_3$ rises and acts to hold the information taken in internally. Furthermore, a one-shot operation is effected in such manner, that it may be reset after an appropriate time has elapsed, and subsequently, a clock $\phi_4$ rises to hold the information within the register. After resetting by the $\overline{CAS}$ was effected and a desired precharge period has elapsed, when the memory device is activated by the $\overline{CAS}$ and enters into a page mode cycle, the clock $\phi_4$ is reset to well hold the information within the register, and only the rise of the transfer clock $\phi_1$ is waited for. Again the CAS which was converted into the internal MOS level rises, and in response thereto the $CAS_0'$ begins to rise. In accordance with the rise of the $CAS_0'$, the clock $\phi_1$ also rises, so that the information in the column decoder unit which was taken in in the first RAS/CAS cycle and latched is transferred. As a result, the column decoder unit having the address next to the column decoder unit selected in the RAS/CAS cycle is selected. At this moment, since the $CAS_0$, $CAS_1$, $CAS_2$ and RE are activated in synchronism with the $\overline{RAS}$, decision of selection/unselection of column decoder units in a page mode cycle, is effected in response to the clock $\phi_1$ only. Therefore, among the time required before decision of the column decoder units in the heretofore known page mode cycle, the time required for operation of the column address buffer, at least the operation time of the $CAS_1$ and $CAS_2$ clock generators can be omitted, and therefore, the present invention brings about a remarkable effect in the shortening of the access time. When a column decoder unit is selected in response to the clock $\phi_1$, the RE' rises in response to the selection and connects the selected digit line to the data input/output bus. At the same time, the clock $\phi_1$ is reset, resulting in termination of the transfer, the clock $\phi_2$ rises, and so, the states of the respective decoder units are taken is as logic information. The clock $\phi_2$ is preset in such manner that it may maintain "1" level until it is reset by the $\overline{CAS}$ clock. Subsequently to the rise of the RE', the DE rises, so that the memory cell information appearing on the data input/output bus is amplified and transmitted via an output buffer to an output terminal. Furthermore, when the clock $\phi_2$ is reset by the $\overline{CAS}$, the clocks $\phi_3$ and $\phi_4$ are generated successively, and operate the register so as to hold the column decoder information which was previously taken in. Then the quite novel activation operation in the page mode cycle of the $\overline{CAS}$. It is obvious that subsequently the newly operable cycle can be executed within the guarantee period in which the RAS can maintain a low level, and that such a circuit system does not bring about any hindrance in the memory operation in the heretofore known RAS/CAS cycle.

Next, with regard to the embodiment of the present invention employing a two-phase drive shift register illustrated in FIGS. 8 to 10, description will be made on the timing relation between the two-phase drive clocks and the two-phase multi-address clocks, with reference to FIG. 14. It is to be noted that in the following description, the clock $\phi_1$ in FIG. 8 and the clock $\phi_L$ in FIGS. 9 and 10 correspond to a timing output OGE0, and the clock $\phi_2$ in FIG. 8 and the clock $\phi_T$ in FIGS. 9 and 10 correspond to a timing output PSR.

At first, consideration is made on the case where a RAS/CAS cycle switches to a consecutive access cycle. When the $\overline{RAS}$ shifts from "1" level to "0" level and thereby the memory is activated, the RAS converted into the internal MOS level rises. In response to the RAS, clocks RAS0 and RAS' rise. In response to the RAS0, precharge clocks PX0, PX1, PX2 and PDL are reset, and also a clock RAS 1 rises, so that a row address buffer responds to address information. Address binary codes fed from the address buffer are transmitted to a row decoder, and when selection/unselection operations in the row decoder have been completed, a clock RA rises, so that a selected word line is driven to rise in potential. Thereafter, in response to the RA, clocks SE0, SE1, SE2 and SE3 rise successively, and when sense amplifiers are activated, the information in the N memory cells connected to the selected word line is amplified and refreshed. Then, the circuit operation in response to activation of the $\overline{RAS}$ has been finished.

The first buffer stage to which the $\overline{CAS}$ is input, is normally designed so as to operate in response to an activation clock (for instance, the RA) of the $\overline{RAS}$ in order to assure a gated CAS operation, and thereby it is prevented that the $\overline{CAS}$ by itself starts the buffer stage. Accordingly, only when the RA rises to "1" level and the $\overline{CAS}$ switches from "1" level to "0" level, activation of the $\overline{CAS}$ may be effected. Thereby the CAS converted into the internal MOS level rises. In response to the CAS, clocks CAS0 and CAS' rise in potential. In response to the CAS0, precharge clocks PY0, PY1, PY2 and PIO are reset, at the same time a clock CAS 1 rises, and a column address buffer responds to address information. When address binary codes are transmitted from the address buffer to a column decoder and selection/unselection operations in the column decoder have been completed, the RE rises. The rise of the RE is subjected to control by a $\overline{RAS}$ series activation clock, for instance, the clock SE3. This is done for the purpose of controlling by the SE3 the timing of opening of a transfer switch for transmitting the memory cell information amplified by the sense amplifiers to the input/output bus as a driven by the SE on the basis of the column decoder information, that is, for the purpose of assuring an operation margin of the memory by transmitting the information to the input/output bus after the amplification by the sense amplifiers has been completed. In response to the RE, clocks DE1 and DE2 rise successively, and thereby a data amplifier is activated. On the other hand, a shift register latch clock OGE which is generated in synchronism with the CAS, is generated after generation of the CAS'. Subsequently, in response to this clock OGE, and also in response to the SE3 and completion of the operation of the column address buffer, a clock OGE0 is generated. This clock OGE0 functions as a selective drive clock ($\phi_1$, $\phi_2$) for the input/output bus pairs. In more particular, in a RAS/CAS cycle, a column decoder for connecting a digit line to an input/output bus and a decoder to be used solely in a consecutive access mode for selecting a plurality of pairs of input/output buses, are almost simultaneously operated, and in this way contrivance is made such that increase of an access time in a RAS/CAS cycle may not be resulted. Subsequently, in response to the OGE0, precharge clock OP0, OP and PSR are reset and a clock OE is generated to activate an output buffer for transmitting memory cell information to a data output terminal.

Thereafter, when the operation switches to a consecutive access cycle, since the column address information decided in the RAS/CAS cycle has been taken in the shift register by the latch clock OGE, the column address information is transferred to the column decoder unit corresponding to the next address by the transfer clock PSR (corresponding to $\phi_2$, $\phi_T$ in the previous description) generated during the reset period of the $\overline{CAS}$. When the $\overline{CAS}$ switches from "1" level to "0" level, immediately the OGE is generated to start the latch operation. On the other hand, since the first buffer stage adapted to generate the CAS is designed to be subjected to the control by the RE, after the RE has risen in the RAS/CAS cycle, the control by the $\overline{CAS}$ is inhibited, so that even after the operation bas switched to the consecutive access cycle controlled only by the $\overline{CAS}$, the CAS is not reset but is maintained in an activated state. When the OGE rises, the I/O bus pair drive clock CSE0 rises in response to the OGE, and thus select an input/output bus pair. Simultaneously with or somewhat later than the rise of the OGE0, the OE rises to amplify the information fed from the selected input-/output bus pair by the output buffer amplifier and transmit the amplified information to the output buffer. Thereafter, when the $\overline{CAS}$ is reset, the OP0, OP and PSR rise, and hence, precharge of the output buffer amplifier by the OP and transfer operation of the decoded information by the PSR are commenced.

As described above, according to the present invention, a novel memory device is provided which is characterized in that after completion of necessary operations in the so-called RAS/CAS cycle in which the $\overline{RAS}$ and the $\overline{CAS}$ are successively activated, consecutive column addresses are internally produced on the basis of the previously introduced column address information without intervention of the operation of the column address buffer and decoder. As a result, the memory device can have a quite novel function of accessing to the memory at a higher speed than that in the prior art.

FIG. 15 shows one practical example of the random access memory having a 64K words X 1 bit construction on the basis of the second system shown in FIG. 4, and FIG. 16 illustrate terminal connections of the random access memory. In FIG. 16, reference symbols $A_0$ to $A_7$ represent address input terminals in which symbols $A_0$ to $A_6$ concern to refresh addresses, reference symbols $D_{in}$ and $D_{out}$ represent data input and data output terminals, reference symbol WE represents a read/write control terminal, and reference symbol N/C represents a non-connection terminal. According to the illustrated example, in the RAS/CAS cycle the device functions as a random access memory having a 64K words X 1 bit construction, whereas in the new mode that can be realized according to the present invention (temporarily, let us call it "shift mode" or "consecutive access mode"), the device can realize a high-speed sequential access memory having a pseudo 8K words X 8 bits construction, and moreover, the device can be packed in the conventional 16-pin package. Therefore, the illustrated device brings about remarkable effects and advantages both in functions and in practical mounting.

In the illustrated memory device, in view of the fact that the refresh cycles are limited to 128 cycles, memory cell arrays 51 of 126 rows X 256 columns are disposed in two sets, and there are provided two sets 52 of 256 sense/refresh amplifiers, one for each column. In addition, 128 row decoder units 53 for selecting a word line are disposed, one set for each array. There are provided 64 column decoder units 54 for transmitting and switching the memory cell information amplified by the sense/refresh amplifier 52 from the digit lines to 8 pairs of input/output data buses 56 in a unit of 8 pairs, further there is provided another decoder 55 associated with a shift register for selecting one pair out of the 8 pairs of input/output buses, and also there is provided an output buffer 57 for level-converting the memory cell information appearing on the one pair of input/output data buses 56 selected by the decoder 55 and transmitting the level-converted information externally. The row decoders 53 and the column decoders 54 receive row and column address codes, respectively, from 8-bit row and column address buffers 58 and 59 which have the functions of receiving row and column address signals, respectively, and converting them into binary address codes at the internal MOS level. In addition, a drive circuit for the above-mentioned principal function block is composed of a row address strobe signal generator, a column address strobe signal generator, a write/-read control signal generator and a write data input buffer. As described above, the memory device according to the present invention which employs the multi-address system and the single 5 V power supply system, can be packed in a 16-pin package without any difference in configuration from the conventional 64K RAM, and hence, the effects of the improvements in the practical mounting of the memory device are remarkable.

Now, a series of operations of the memory device according to the present invention will be briefly explained with reference to FIG. 15. In response to the switching of the $\overline{RAS}$ clock from "1" level to "0" level, a series of necessary activation signals are generated. At first, a row address input signal is introduced into 8 row address buffer units, and thereby binary address codes at the internal MOS level are produced. Among these binary codes produced by the address buffer, 7 bits are transmitted to the row decoder, in which selection-/unselection operations of row docoder units are effected, and the remaining one bit is transmitted to the column decoder. Among two sets of row decoders, each consisting of 128 row decoders, one decoder in each set is selected, and in response to a word line drive clock generated upon sensing the selection/unselection of the row decoder units, the corresponding word line is selected, so that information of the memory cells connected to the selected word line is transmitted to the digit line sense amplifiers. Thereafter, when a word line drive clock is received, the sense amplifiers start amplification in response to a sense amplifier activation clock. In the case where the $\overline{CAS}$ clock comes in before selection/unselection of the row decoder units is decided in the midway of a series of operations activated by the $\overline{RAS}$ clock, then an operation called GATED CAS operation occurs in which generation of necessary activation clocks in response to the $\overline{CAS}$ is temporarily delayed. In other words, this operation is an essential function in a RAM of the multi-address system, and normally a series of necessary activation clocks would be generated in response to the $\overline{CAS}$ clock, in such manner that after the decision of selection/unselection of the row decoder units in response to the $\overline{RAS}$ clock, further waiting for the termination of the amplification by the sense amplifiers, and then selection/unselection of the column decoder units may be decided.

When the $\overline{CAS}$ clock comes in, the column address signal is introduced into 8 column address buffer units, where binary address codes at the internal MOS level are produced. Among the binary codes produced in these address buffer units, 5 bits are transmitted to the column decoder, where selection/unselection operations of the column decoder units are effected. The remaining three bits are fed to another decoder which selects one pair among 8 pairs of input/output buses. The column decoder 54 consisting of 64 column decoder units achieve switching of connection/disconnection between one unit of 8 pairs of input/output buses and digit line groups such consisting of 8 digit lines, in response to one bit of row address binary codes fed from the row address buffer and 5 bits of column address binsry codes fed from the column address buffer. In this column decoder, when a column decoder buffer activation signal rises, 8 digit lines connected to the selected decoder unit are connected to the 8 pairs of input/output data buses, and thereby the memory cell information is transmitted to the input.output data buses. 8 pairs of data amplifiers connected to the input-.output data buses are activated, and signal amplification is effected. The selection/unselection operations in the additional decoder containing a shift-register therein which selects one pair among the 8 pairs of input/output data bases and connects to an output buffer, have been already finished at this moment, and therefore, the level on the selected input/output data bus has been in itself transmitted to the output buffer. Subsequently, an output buffer activation signal rises, so that the information of the selected memory cell appears at the data output terminal. Thereafter, the $\overline{\text{RAS}}$ and the CAS both switch from "1" level to "1" level, and then a normal RAS/CAS cycle has been finished. The additional decoder containing a shift register therein for selecting one pair out of the 8 pairs of input-/output data buses, introduces the information of selection/unselection in this decoder into the shift register in each cycle, and so long as the normal RAS/CAS cycles continue, in each cycle the information is introduced and renewed. Subsequently to the RAS/CAS cycles, if the operation switches to a novel consecutive access mode cycle according to the present invention, that is, to the cycle in which the $\overline{\text{RAS}}$ is maintained at "0" level and only the $\overline{\text{CAS}}$ clock controls the operation, then since the sense amplifiers actuated by the internal clocks produced in response to the $\overline{\text{RAS}}$ as well as the data amplifiers connected to the column decoder for connecting the digit lines to the input/output data buses and to the 8 pairs of input/output data buses, are maintaned in an activated condition, the state is maintained where the information of the selected memory cells has been transmitted to just before the decoder for selecting 8 pairs of input/output data buses. Accordingly, if the operation switches from the RAS/CAS cycle to the consecutive access mode relying upon the $\overline{\text{CAS}}$ clock only, then the selection/unselection condition of the input/output data bus selecting decoder in the RAS/-CAS cycle is introduced into the contained shift register, so that the 8 consecutive memory cells on the same word line starting from the memory cell selected in the RAS/CAS cycle can be accessed in a consecutive access mode. In the consecutive access mode, only the transfer in the shift register and the activation of the 8-bit decoder and the output buffer are necessitated. Consequently, in the novel consecutive access mode subsequent to the RAS/CAS cycle, not only it is possible to access to memory cell information at consecutive 8-bit addresses at a higher speed than in the heretofore known page mode, but also a surplus effect for mitigating the operating condition that supply of column address information is unnecessary in this mode, is produced, as shown in FIG. 17 (b) in contrast to the case in the prior art illustrated in FIG. 17 (a) because the decoder has the function of internally producing consecutive addresses.

As described above, the memory device provided according to the present invention is an epoch-making device in that not only it is perfectly compatible to the conventional 16-pin mount 64K words X 1 bit random access memory in the RAS/CAS cycle, but also a novel consecutive access mode cycle to be replaced for the heretofore known page mode can be realized, and a remarkable effect that the access time can be reduced to one-half is produced, and in that the memory device is characterized by the simplicity in use that there is no need to externally feed consecutive addresses.

We claim:

1. A semiconductor memory device comprising a memory array including a plurality of memory cells arranged in rows and columns, first means for receiving a row strobe signal, second means for incorporating row address information in response to said row strobe signal, third means for receiving a column strobe signal, fourth means for incorporating column address information in response to said column strobe signal, fifth means for selecting a row of said memory cell array in response to the incorporated row address information, and sixth means for selecting at least one column of said memory cell array, said sixth means including shift register means having a plurality of shift stages, each of output terminals of said shift stages being used to select the corresponding column when it is energized, decode means for setting a state of said shift register means in response to the incorporated column address information, means for generating a shift signal each time said column strobe signal is activated during a period when said row strobe signal is activated, and eighth means for supplying said shift register means with said shift signal to thereby change the column address location as selected by said shift register means.

2. The memory device according to claim 1, further comprising at least one bus line to which the selected column of said memory cell array is electrically coupled.

3. The memory device according to claim 2, further comprising a plurality of transfer gates coupled between said data bus line and each of said columns.

4. A semiconductor memory device comprising a memory cell array including a plurality of memory cells arranged in rows and columns, a first terminal for receiving a row strobe having first and second levels, row selection means for selecting a row of said array in response to said second level of said row strobe signal, a second terminal for receiving a column strobe signal having third and fourth levels, column decode means for operatively selecting one of said columns in response to said fourth level of said column strobe signal during a period when said row strobe signal is at said second level, shift signal generating means for generating a shift signal every time said column strobe signal changes from said third level to said fourth level when said row strobe signal is maintained at said second level after selection of said column by said column decode means, and shift register means coupled to said column decode means and having a plurality of shift stages, an output signal of each of said shift stages being adapted to select a corresponding one of said columns when it is energized, said shift register shifting the column location selected by said column decode means in response to said shift signal.

5. The memory device according to claim 4, further comprising a common data line, and a plurality of transfer gates each coupled between the corresponding one of said columns and said common data line.

6. The memory device according to claim 4, in which said shift signal generating means includes a first gate receiving said row strobe signal, and a second gate receiving said column strobe signal and a signal from said first gate.

7. The memory device according to claim 4, further comprising a plurality of sense amplifiers each for a corresponding one of said columns.

8. A memory device comprising a memory cell array including a plurality of memory cells arranged in rows and columns, a first terminal for receiving a row strobe signal, a second terminal for receiving a column strobe signal, first means for incorporating row address information in response to an active level of said row strobe signal, second means for incorporating column address information in response to an active level of said column strobe signal, row selecting means for selecting one of said rows based on the incorporated row address information, a first number of first bus lines, said first number being smaller than the number of said columns and larger than 1, first column selection means responsive to a first part of said column address information for selecting said first number of columns out of said columns to be connected to said first number of first bus lines, a second bus line, second column selection means for selecting one of said first number of columns to be connected to said second bus lines, said second column selection means including shift register means, decode means coupled to said shift register means for setting an output stage of said shift register in response to a second part of said column address information, and control means for controlling shift operation of said shift register means.

9. The memory device according to claim 8, in which said control means includes means for generating a shift signal for said shift register means every time said column strobe signal changes from an inactive level to an active level during a period when said row strobe signal is in said active level after said column address information is incorporated.

10. A memory device comprising a memory cell array including a plurality of memory cells arranged in rows and columns, a first terminal for receiving a row strobe signal, first means for selecting one of said rows under control of said row strobe signal, a second terminal for receiving a column strobe signal, second means for incorporating column address information in response to an active level of said column strobe signal, a first number of first data lines, first column selection means for selecting said first number of columns to be connected to said first data lines from said columns in response to a first part of said column address information, and a second data line, second column selection means for selecting one to be electrically connected to said second data line from said first number of first data lines, said second column selection means including shift register means whose output is used to select said first number of first data lines, decode means for setting an output state of said shift register means in response to a second part of said column address information, shift signal generating means for generating a shift clock every time when said column strobe signal becomes an inactive level under the state that said row strobe signal is in said active level, and means for supplying said shift register means with said shift signal.

11. The memory device according to claim 10, further comprising a first number of transfer gates each coupled between the corresponding one of said first data lines and said second data line.

* * * * *

UNITED STATES PATENT AND TRADEMARK OFFICE
CERTIFICATE OF CORRECTION

PATENT NO. : 4,429,375

DATED : Jan. 31, 1984

INVENTOR(S) : Kobayashi et al.

It is certified that error appears in the above-identified patent and that said Letters Patent is hereby corrected as shown below:

IN THE ABSTRACT:

Line 1, delete "A high speed" and substitute therefor --An improved memory device operable at a high speed is disclosed. The--.

IN THE SPECIFICATION:

Column 1, line 9, after "as" delete the ",";

lines 29-30, insert a -- - -- (hyphen) after "large" and before "scale";

line 30, change "super large scale" to --super-large-scale--;

line 44, change "addressed" to --addresses--.

Column 2, line 64, change "occurence" to --occurrence--.

Column 4, line 44, change "word" to --words--;

line 58, change "RAKM" to --RAM--.

UNITED STATES PATENT AND TRADEMARK OFFICE
CERTIFICATE OF CORRECTION

PATENT NO. :   4,429,375

DATED      :   Jan. 31, 1984

INVENTOR(S):   Kobayashi et al.

It is certified that error appears in the above-identified patent and that said Letters Patent is hereby corrected as shown below:

Column 5, line 54, change "in" to --is--.

Column 6, line 12, change "fuses" to --buses--.

Column 8, line 48, change "responce" to --response--.

Column 9, line 12, change "On" to --One--.

Column 11, line 22, change "ride" to --rise--.

Column 12, line 28, change "fast" to --fact--.

Column 15, line 24, change "is" to --in--.

Column 16, line 18, change "uncelection" to --unselection--;

line 65, change "bas" to --has--.

Column 18, line 65, change "binsry" to --binary--.

UNITED STATES PATENT AND TRADEMARK OFFICE
CERTIFICATE OF CORRECTION

PATENT NO. : 4,429,375

DATED : Jan. 31, 1984

INVENTOR(S) : Kobayashi et al.

It is certified that error appears in the above-identified patent and that said Letters Patent is hereby corrected as shown below:

Column 19, line 2, change "input.output" to --input/output--;

lines 3 and 4, change "input-.output" to --input/output--;

line 16, change "1" (first occurrence) to --0--.

line 62, change "it is" to --is it--.

Signed and Sealed this

Sixteenth Day of April 1985

[SEAL]

Attest:

DONALD J. QUIGG

Attesting Officer     Acting Commissioner of Patents and Trademarks